(12) United States Patent
Kodama et al.

(10) Patent No.: US 7,777,348 B2
(45) Date of Patent: Aug. 17, 2010

(54) SEMICONDUCTOR DEVICE

(75) Inventors: Chikaaki Kodama, Yokohama (JP);
Mikihiko Ito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 11/960,097

(22) Filed: Dec. 19, 2007

(65) Prior Publication Data

US 2008/0157393 A1 Jul. 3, 2008

(30) Foreign Application Priority Data

Dec. 27, 2006 (JP) ............................. 2006-353225

(51) Int. Cl.
*H01L 23/48* (2006.01)
*H01L 23/52* (2006.01)
(52) U.S. Cl. ..................... 257/777; 257/723; 257/686; 257/E23.01; 257/E23.02; 257/E23.063
(58) Field of Classification Search ................. 257/777, 257/723, 784, 786, 225.013
See application file for complete search history.

(56) References Cited

U.S. PATENT DOCUMENTS

| | | | |
|---|---|---|---|
| 6,359,340 B1 | 3/2002 | Lin et al. | |
| 6,461,897 B2 | 10/2002 | Lin et al. | |
| 6,650,008 B2 | 11/2003 | Lee et al. | |
| 6,696,320 B2 | 2/2004 | Gacusan | |
| 2006/0071317 A1 | 4/2006 | Kang et al. | |

FOREIGN PATENT DOCUMENTS

| CN | 2558082 Y | 6/2003 |
|---|---|---|
| JP | 2005-286126 | 10/2005 |

OTHER PUBLICATIONS

U.S. Appl. No. 11/780,240, filed Jul. 19, 2007, Mikihiko Ito, et al.

*Primary Examiner*—Fernando L Toledo
*Assistant Examiner*—Mamadou Diallo
(74) *Attorney, Agent, or Firm*—Oblon, Spivak, McClelland, Maier & Neustadt, L.L.P.

(57) ABSTRACT

A semiconductor device comprises a package board, a first semiconductor chip which is rectangular in shape, has a plurality of first pads arranged along its short side and is placed on the package board, and a second semiconductor chip which is rectangular in shape, has a plurality of second pads arranged along its short side and is placed on the first semiconductor chip so that a vertex of the second semiconductor chip at which its long side and its short side along which no pads are arranged meet falls on a vertex of the first semiconductor chip at which its long side and its short side along which no pads are arranged, and the long sides of the first and second semiconductor chips intersect each other.

8 Claims, 19 Drawing Sheets

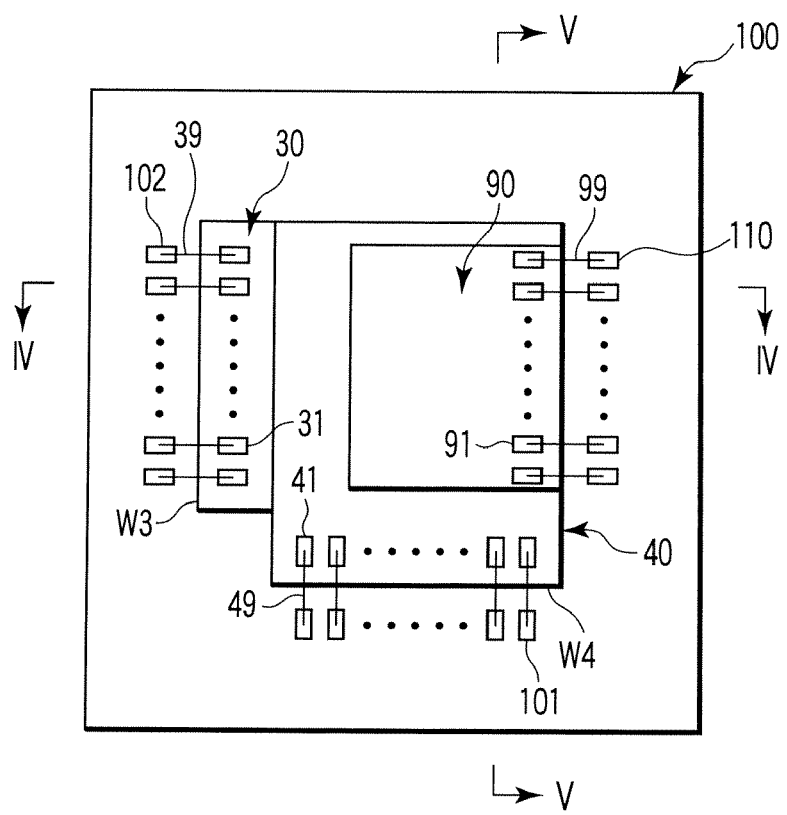
F I G. 3
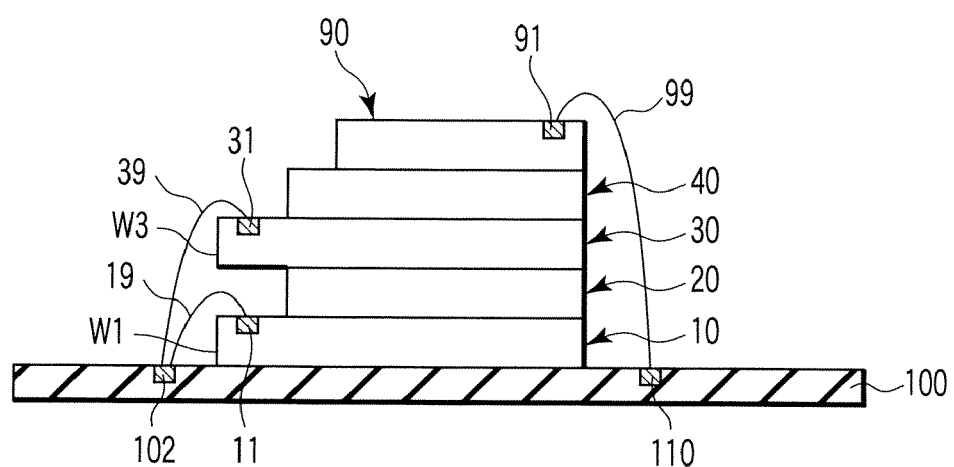
F I G. 4

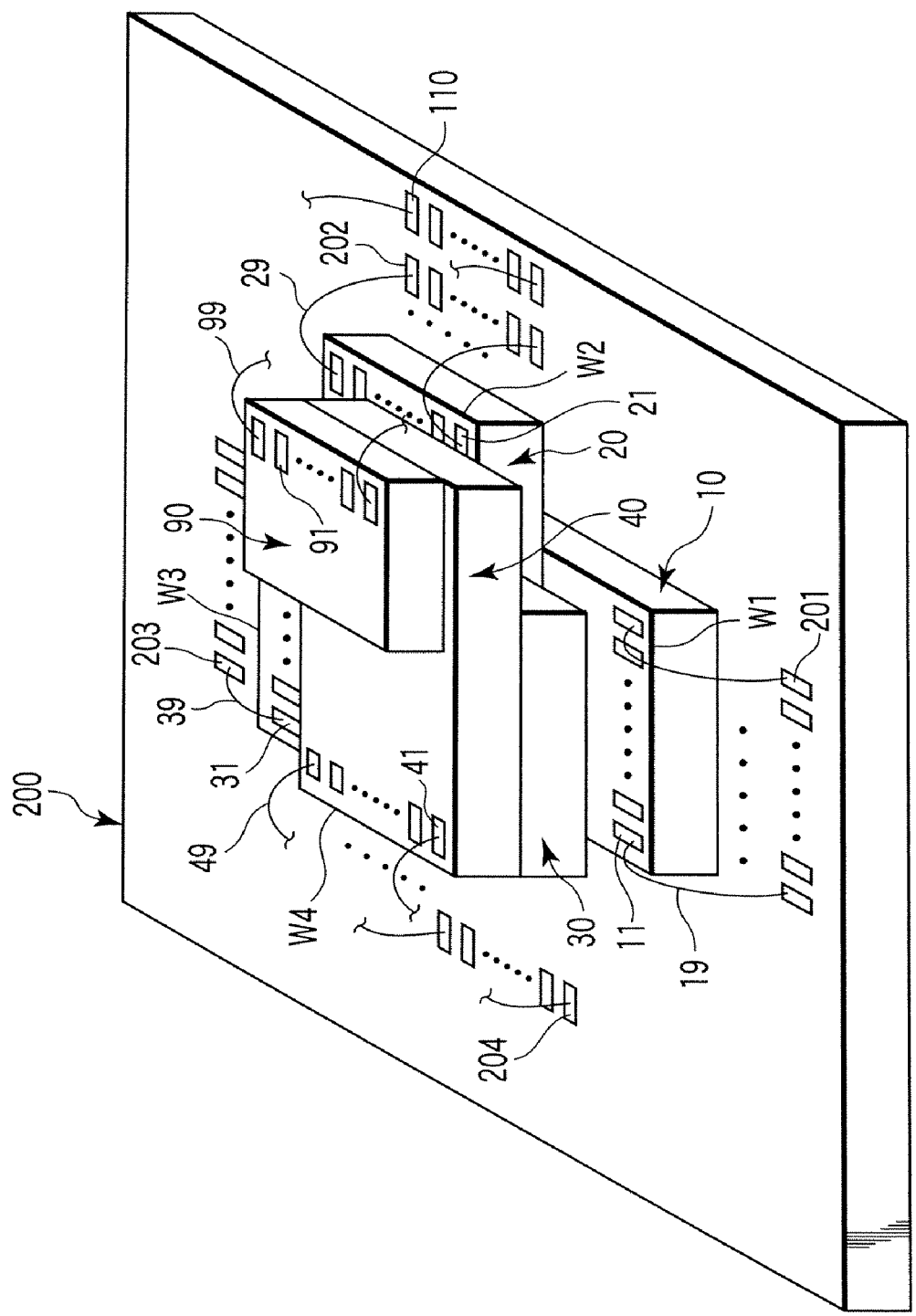
F I G. 16

SEMICONDUCTOR DEVICE

CROSS-REFERENCE TO RELATED APPLICATIONS

This application is based upon and claims the benefit of priority from prior Japanese Patent Application No. 2006-353225, filed Dec. 27, 2006, the entire contents of which are incorporated herein by reference.

BACKGROUND OF THE INVENTION

1. Field of the Invention

The invention relates to a semiconductor device and more specifically to a multi-chip package device.

2. Description of the Related Art

In recent years, the demand has sharply increased for portable electronic equipment, such as mobile phones, portable information processing terminals, small-sized music players, etc.

To meet the demand, attempts have been made to miniaturize semiconductor devices.

Accordingly, a System On Chip (SOC) technology to build two or more systems into one semiconductor chip and a multi-chip package (MCP) technology to stack two or more semiconductor chips on one package board have been used in semiconductor devices.

The SOC technology is one by which two or more systems are packaged together in one semiconductor chip. In contrast, the MCP technology is one by which two or more semiconductor chips are incorporated into one package.

With the MCP technology, miniaturization can be effected by contriving a method to stack two or more semiconductor chips (see, for example, JP-A No. 2005-286126 (KOKAI)).

In the structure of an MCP device, wire bonding is used to connect the input/output pads of semiconductor chips to the pads of a package board. Thus, an appropriate space for wire bonding is required in the vicinity of the pads of semiconductor chips.

To this end, a spacer is placed between two semiconductor chips to be stacked, thereby securing a space for wire bonding.

However, the use of a spacer results in an increase in the size in the direction of the thickness of the MCP device.

In addition, as the number of semiconductor chips to be stacked on the package board increases, the number of pads and wires also increases. In such a case, connection between the package board and the semiconductor chips becomes complicated, which can cause short-circuiting of wires. Furthermore, it is intricate to lead board interconnections on the package board.

BRIEF SUMMARY OF THE INVENTION

According to an aspect of the invention, there is provided a semiconductor device comprising: a package board; a first semiconductor chip which is rectangular in shape, has a plurality of first pads arranged along its short side and is placed on the package board; and a second semiconductor chip which is rectangular in shape, has a plurality of second pads arranged along its short side and is placed on the first semiconductor chip so that a vertex of the second semiconductor chip at which its long side and its short side along which no pads are arranged meet falls on a vertex of the first semiconductor chip at which its long side and its short side along which no pads are arranged, and the long sides of the first and second semiconductor chips intersect each other.

According to another aspect of the invention, there is provided a semiconductor device comprising: a package board; a first semiconductor chip which is rectangular in shape, has first and second sets of pads each of which is arranged along a respective one of its two short sides, and is placed on the package board; and a second semiconductor chip which is rectangular in shape, has third and fourth sets of pads each of which is arranged along a respective one of its short side, and is placed on the first semiconductor chip so that the second semiconductor chip is located between the first and second sets of pads of the first semiconductor chip, and the long sides of the first and second semiconductor chips intersect each other.

According to still another aspect of the invention, there is provided a semiconductor device comprising: a package board; a first semiconductor chip which is rectangular in shape, has a first set of pads arranged along its long side and placed on the package board; a second semiconductor chip which is rectangular in shape, has a second set of pads arranged along its long side and placed on the package board so that a long side of the second semiconductor chip along which no pads are arranged come into contact with a long side of the first semiconductor chip along which no pads are arranged; a third semiconductor chip which is rectangular in shape, has a third set of pads arranged along its long side and is placed on the first and second semiconductor chips so that a short side of the third semiconductor chip intersect the short sides of the first and second semiconductor chips; and a fourth semiconductor chip which is rectangular in shape, has a fourth set of pads arranged along its long side and is placed on the first and second semiconductor chips so that a long side of the third semiconductor chip along which no pads are arranged come into contact with a long side of the forth semiconductor chip along which no pads are arranged, and a short side of the forth semiconductor chip intersect the short sides of the first and second semiconductor chips.

BRIEF DESCRIPTION OF THE SEVERAL VIEWS OF THE DRAWING

FIG. 3 is a plan view of the MCP device of the first example;

FIG. 4 is a sectional view taken along line IV-IV of FIG. 3;

FIG. 16 is a perspective view of an MCP device according to a modification of the second example;

DETAILED DESCRIPTION OF THE INVENTION

The embodiments of the present invention will be described hereinafter in detail with reference to the accompanying drawings.

1. Embodiments (A) Outline

The embodiments of the present invention relate to a package structure in which two or more semiconductor chips are stacked in a multi-chip package device (hereinafter referred to as an MCP device).

The present invention will be described in terms of a structure which allows spaces for wire bonding of semiconductor chips to be stacked to be secured without using any spacers and the size of the package device to be made small.

Each of the semiconductor chips to be stacked on top of one another is provided on top with a plurality of pads (chip pads) adapted to input and output data and control signals set on it. The package board is formed on top with a plurality of pads (board pads) to be connected to the chip pads and board interconnections to connect board pads together.

In the description which follows, we will describe layouts of the board interconnections and propose a technique to simplify the leading of the board interconnections.

(B) Semiconductor Chip

Figure 1:
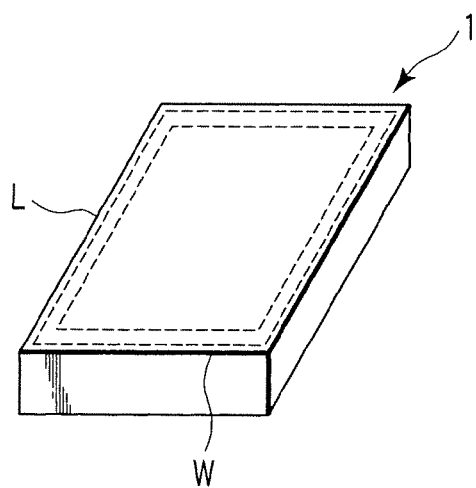
FIG. 1 shows, in a perspective view, the basic structure of a semiconductor chip.

FIG. 1 shows, in a perspective view, the basic structure of a semiconductor chip used in each embodiment to be described hereinafter.

As shown in FIG. 1, the semiconductor chip 1 is a rectangular parallelepiped structure such that its short and long sides are W and L, respectively.

The semiconductor chip 1 is a memory chip, such as a NAND or NOR type flash memory, a DRAM (Dynamic Random Access Memory), a ROM (Read Only Memory), etc. The semiconductor chip 1 may be a logic circuit chip or a merged memory and logic circuit chip.

A number of pads (not shown) are arranged within an area (area enclosed by broken lines) at the edges of the top of the chip 1 along its short W or long side L.

These pads include power pads for applying a supply voltage to the chip and input/output pads for inputting and outputting data and control signals.

Hereinafter, a description is given of an MCP device in which a plurality of semiconductor chips 1 is stacked and packaged using a thin small outline package (TSOP). In each embodiment to be described hereinafter, the type of package is not limited to the TSOP but may be a ball grid array (BGA) by way of example.

(C) First Embodiment

This embodiment is directed to an MCP device which uses semiconductor chips each of which has a set of pads arranged along one of its short sides W.

(1) FIRST EXAMPLE (a) Structure

Figure 2:
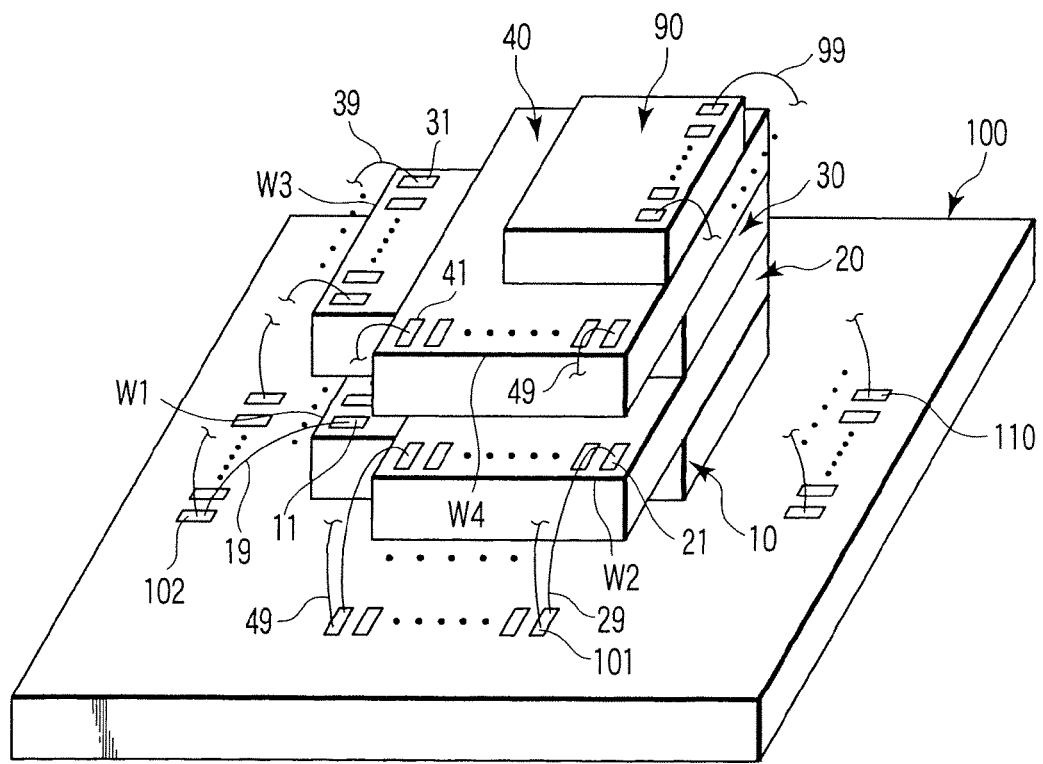
FIG. 2 is a perspective view of an MCP device according to a first example of a first embodiment of the present invention.
Figure 5:
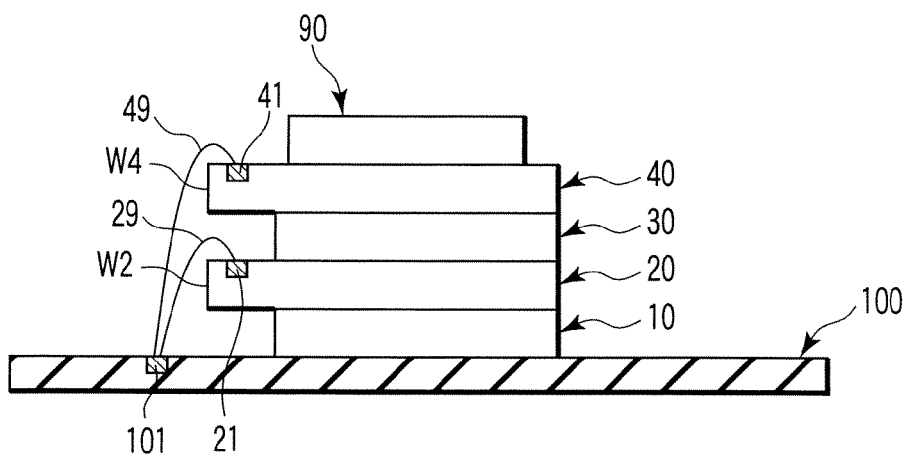
FIG. 5 is a sectional view taken along line V-V of FIG. 3.

FIG. 2 is a perspective view of an MCP device of the first example. FIG. 3 is a plan view of the MCP device of the first example. FIG. 4 is a sectional view taken along line IV-IV of FIG. 3. FIG. 5 is a sectional view taken along line V-V of FIG. 3.

As shown in FIGS. 2 through 5, semiconductor chips 10 to 40 are stacked on a package board 100. In this example, the semiconductor chips 10 to 40 are virtually the same in size. Each of the semiconductor chips is a memory chip comprised of a flash memory by way of example.

The semiconductor chips 10 to 40 are stacked one on top of another with a thin insulating layer, such as an insulating adhesive, interposed therebetween. Although this embodiment is configured such that four semiconductor chips are stacked, the number of semiconductor chips is not limited to four. It is only required that at least two semiconductor chips are stacked.

The semiconductor chip 10 has a set of pads 11 arranged on its top. Hereinafter, the pads arranged on a semiconductor chip are referred to as the chip pads. The chip pads 11 are arranged along one short side W1 of the chip.

As with the semiconductor chip 10, the semiconductor chips 20, 30 and 40 are provided with sets of chip pads 21, 31 and 41 along their respective short sides W2, W3 and W4.

The first semiconductor chip 10 is placed above the package board 100 with a thin insulating layer of, for example, an insulating adhesive interposed therebetween.

The second semiconductor chip 20 is placed on the first semiconductor chip 10 so that its short side along which no chip pads are arranged falls along a long side of the underlying chip 10 and its back side does not come into contact with the chip pads 11 of the underlying chip.

In addition, the first and second semiconductor chips 10 and 20 are stacked so that a long side of the overlying chip 20 falls along the short side of the underlying chip 10 along which no chip pads are arranged.

That is, the semiconductor chips are stacked so that a vertex of the overlying semiconductor chip at which its long side and its short side along which no pads are arranged meet falls on such a vertex of the underlying semiconductor chip and the long sides of the overlying and underlying semiconductor chips intersect each other. The length of the short side of the overlying semiconductor chip is set such that the back side of the overlying chip will not come into contact with the chip pads of the underlying chip when the overlying and underlying chips are stacked in the above manner.

Stacking the two semiconductor chips 10 and 20 in the above manner results in a structure such that the chip pads of the underlying semiconductor chip are not overlaid with the overlying semiconductor chip.

Therefore, the package size can be reduced. A space for wire bonding of the underlying semiconductor chip can be secured.

Each of the chip pads of each semiconductor chip is allocated a different function. The chip pads 21 on the semiconductor chip 20 are arranged so that right and left are interchanged with respect to the chip pads 11 on the semiconductor chip 10. In the embodiments of the present invention, such an arrangement of pads as right and left are interchanged is referred to as mirror arrangement or being arranged in a mirror relation with respect to pads of another semiconductor chip.

The third semiconductor chip 30 is placed on the second semiconductor chip 20 so that a vertex of the chip 30 at which its short side along which no pads are arranged and its long side meet falls on such a vertex of the chip 20. Thereby, wire bonding space for the chip pads 21 of the second semiconductor chip 20 is secured.

The short side W3 of the third semiconductor chip 30 and the short side W1 of the first semiconductor chip 10 are located on the same side. Therefore, the chip pads 11 of the semiconductor chip 10 are overspread with the back of the semiconductor chip 30. In this case, since the semiconductor chip 20 is interposed between the semiconductor chips 10 and 30, the space in the direction of thickness for wire bonding of the chip pads 11 is secured by means of the thickness of the chip 20. That is, the semiconductor chip 20 plays the role of a spacer.

The arrangement of chip pads 31 of the third semiconductor chip 30 is the same as that of the chip pads 11 of the first semiconductor chip 10.

The fourth semiconductor chip 40 is placed on the third semiconductor chip 30 so that a vertex of the chip 40 at which its short side along which no pads are arranged and its long side meet falls on such a vertex of the chip 30. Thereby, wire bonding space for the chip pads 31 of the third semiconductor chip 30 is secured.

The short side W4 of the fourth semiconductor chip 40 and the short side W2 of the second semiconductor chip 20 are located on the same side. The space in the direction of thickness for wire bonding of the chip pads 21 is secured by means of the thickness of the chip 30.

The arrangement of the chip pads 41 of the fourth semiconductor chip 40 is the same as that of the chip pads 21 of the second semiconductor chip 20.

The above-mentioned semiconductor chips to be stacked contain chips having chip pads in mirror arrangement; however, this is not restrictive and all the semiconductor chips may be the same in the arrangement of chip pads.

When each of the semiconductor chips 10 to 40 is a memory chip, a memory controller chip 90 is placed on the semiconductor chip 40 so that its bottom will not cover the chip pads 41.

The memory controller chip 90 controls the memory chips. The memory controller chip may be placed on the package board 100 or on another board as opposed to being placed on the semiconductor chip 40.

Sets of board pads 101 and 102 are arranged on the package board 100, which are connected to the chip pads 11 to 41.

The board pads 102 are arranged on the package board 100 so that they are parallel to the short sides W1 and W3 of the respective semiconductor chips 10 and 30.

The chip pads 11 and 31 are connected to the board pads 102 by means of bonding wires 19 and 39.

When corresponding pads of the sets of chip pads 11 and 31 of the semiconductor chips 10 and 30 have the same function, they may be connected together to one of the board pads 102.

Likewise, the board pads 101 are arranged on the package board 100 so that they are parallel to the short sides W2 and W4 of the semiconductor chips 10 and 30 and connected to the chip pads 21 and 41 by means of bonding wires 29 and 49. When the chip pads of the semiconductor chips 20 and 40 are arranged in a mirror relation with respect to the ones of the chips 10 and 30, the board pads 101 are also arranged in a mirror relation with respect to the board pads 102.

The corresponding pads of the sets of board pads 101 and 102 are connected together by a board interconnection (not shown) and further connected to an external terminal (not shown). The layout of the board interconnections will be described later.

The package board 100 is also formed on top with board controller pads 110, which are connected to the memory controller chip 90 by means of bonding wires 99.

The bonding wires 19 to 49 and 99 are each a conducting wire, such as an Au wire.

As described above, the semiconductor chips are stacked so that the short side of the overlying chip along which no chip pads are arranged falls along a long side of the underlying chip. That is, the semiconductor chips are stacked so that a vertex of the overlying semiconductor chip at which its long side and its short side along which no pads are arranged meet falls on such a vertex of the underlying semiconductor chip and the long sides of the overlying and underlying semiconductor chips intersect each other.

In addition, the semiconductor chips are stacked so that the back side of the overlying chip does not come into contact with the chip pads of the underlying chip.

When an additional semiconductor chip is placed on the overlying semiconductor chip, the overlying chip plays the role of a spacer for providing space in the direction of its thickness in wire bonding of the underlying semiconductor chip.

Accordingly, space for wire bonding of the underlying semiconductor chip can be secured without using any spacer, allowing the size in the direction of the thickness of the package to be reduced.

Thereby, a number of semiconductor chips can be stacked, allowing the package size to be reduced.

Although the embodiment has been described in terms of an MCP device of four-layer structure, there is no limit to the number of semiconductor chips to be stacked.

In this embodiment, semiconductor chips of different types may be used. If a number of semiconductor chips could be stacked in the above manner and spaces for wire bonding could be secured, the chips would not need to be the same size.

(b) Interconnection Layouts of Package Board

The package board is formed on top and underneath with board interconnections to connect the board pads and the external terminals.

The interconnection layout of the package board will be described below. The interconnection layouts illustrated here schematically represent interconnections and are therefore illustrative and not restrictive. The interconnection layouts will be described here on the assumption that the semiconductor chips and the package board are provided with sets of eight pads. Note that the number of pads of each set given here is merely exemplary.

Figure 6:
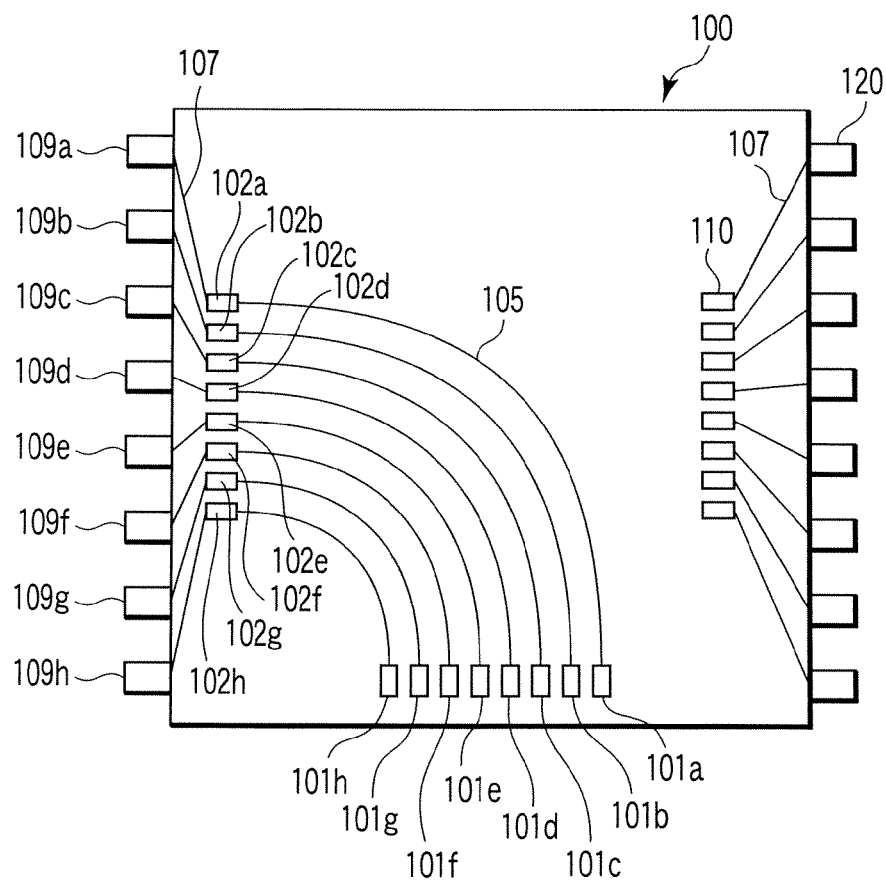
FIG. 6 schematically show interconnection layouts of the package board of the MCP device.
Figure 7:
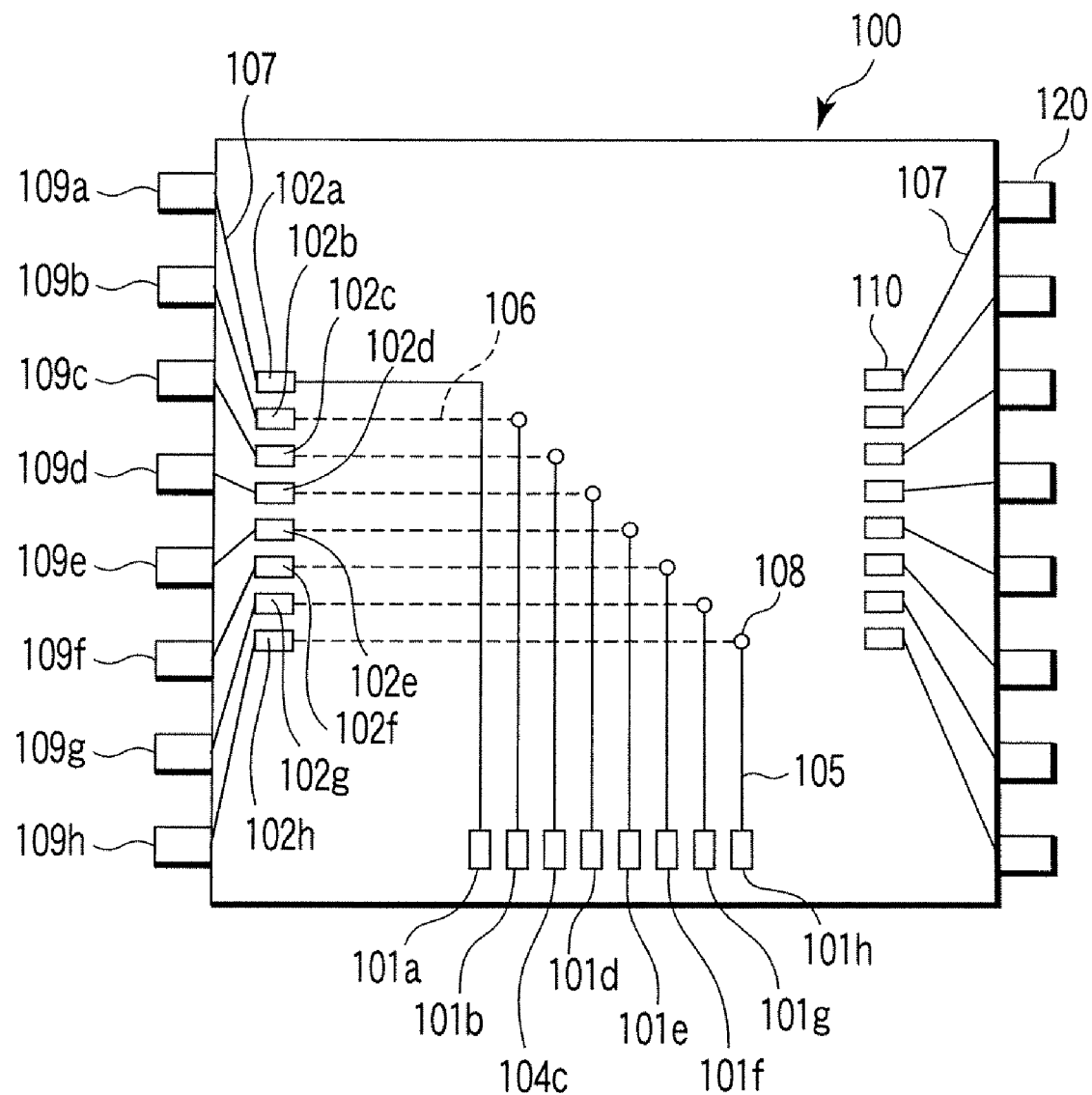
FIG. 7 schematically show interconnection layouts of the package board of the MCP device.

FIGS. 6 and 7 schematically show the interconnection layouts of the package board 100, which is, for example, a TSOP board.

As described previously, the chip pads of the semiconductor chips and the board pads of the package board are connected by means of bonding wires.

It is desired that the board pads and the chip pads are connected so that wire bonding will not become complicated. To this end, when the chip pads of a semiconductor chip are in mirror arrangement, the bonding pads to be connected to these chip pads are also set in mirror arrangement.

FIG. 6 shows an interconnection layout in a case where board pads 102a to 102h are arranged in a mirror relation with respect to board pads 101a to 101h.

As shown in FIG. 6, the package board 100 is formed on top with board pads 101a to 101h and 102a to 102h to be connected to semiconductor chips. These board pads are arranged parallel to the short sides of semiconductor chips along which chip pads are arranged. Board controller pads 110 to be connected to the controller pads of the memory controller chip are set on the package board 100.

The board pads 101a to 101h are connected to the board pads 102a to 102h, respectively, by means of board interconnections 105. The board pads 102a to 102h are respectively connected to external terminals 109a to 109h for connection to an external device (not shown) by means of board interconnections 107. Consequently, the board pads 101a to 101h are connected to the external terminals 109a to 109h through the board pads 102a to 102h.

The board controller pads 110 are connected to external terminals 120 for the controller chip by board interconnections 107.

As shown in FIG. 6, the board pads 102a to 102h are arranged on the package board 100 in a mirror relation with respect to the board pads 101a to 101h.

If the arrangement of the bonding pads 101a to 101h were identical to that of the bonding pads 102a to 102h, it would become complicated to lead the board interconnections on the surface of the package board so that they will not contact each other. Such leading of interconnections would result in an increase in the package size.

Therefore, putting the chip and board pads in mirror arrangement as in this embodiment allows the interconnection layout to connect corresponding board pads to be simplified.

A description is given below of a case where overlying and underlying semiconductor chips are the same in the arrangement of chip pads. In that case, the arrangement of the board pads 101a to 101h may be the same as that of the board pads 102a to 102h.

FIG. 7 shows an interconnection layout where the arrangement of the board pads 102a to 102h is the same as that of the board pads 101a to 101h.

The board pad 101a is electrically connected to the board pad 102a by means of a board interconnection (solid line) 105 set on the surface of the package board 100.

Through holes are formed in the package board 100 and are each filled with a conducting material to form a contact 108.

The contact portions 108 allows board interconnections (broken lines) 106 formed on the back side of the package board 100 to be connected to the board interconnections 105 formed on the top of the package board. Thereby, the board pads 101b to 101h are electrically connected to the board pads 102b to 102h, respectively. Thus, connecting the board interconnections formed on the top and the back of the package board through the contacts allows the leading of board interconnections to be simplified even if the semiconductor chips and the package board are the same in the arrangement of their pads.

As described above, the use of the interconnection layouts shown in FIGS. 6 and 7 allows the leading of board interconnections to be simplified.

(c) Conclusion

The above-stated stacked structure of semiconductor chips and interconnection layout of the package board allow spaces for wire bonding of lower semiconductor chips to be secured without using any spacer. Furthermore, since a number of semiconductor chips can be stacked one on top of another, the package size can be reduced.

In addition, the leading of board interconnections of the package board can be simplified.

(2) SECOND EXAMPLE

In the MCP device of the first embodiment, the sides of a number of semiconductor chips, which are stacked one above the other, along which chip pads are arranged are oriented in two different directions. Therefore, bonding wires of alternate semiconductor chips are positioned to one side of the package board, which may cause or threaten short-circuiting of wires.

Hereinafter, a description is given of an MCP device which is adapted to prevent short-circuiting of bonding wires.

In this example, like reference numbers are used to denote corresponding parts to those in the first example, thereby simplifying the description.

(a) Structure

The MCP device of this embodiment will be described with reference to FIGS. 8 through 11.

Figure 8:
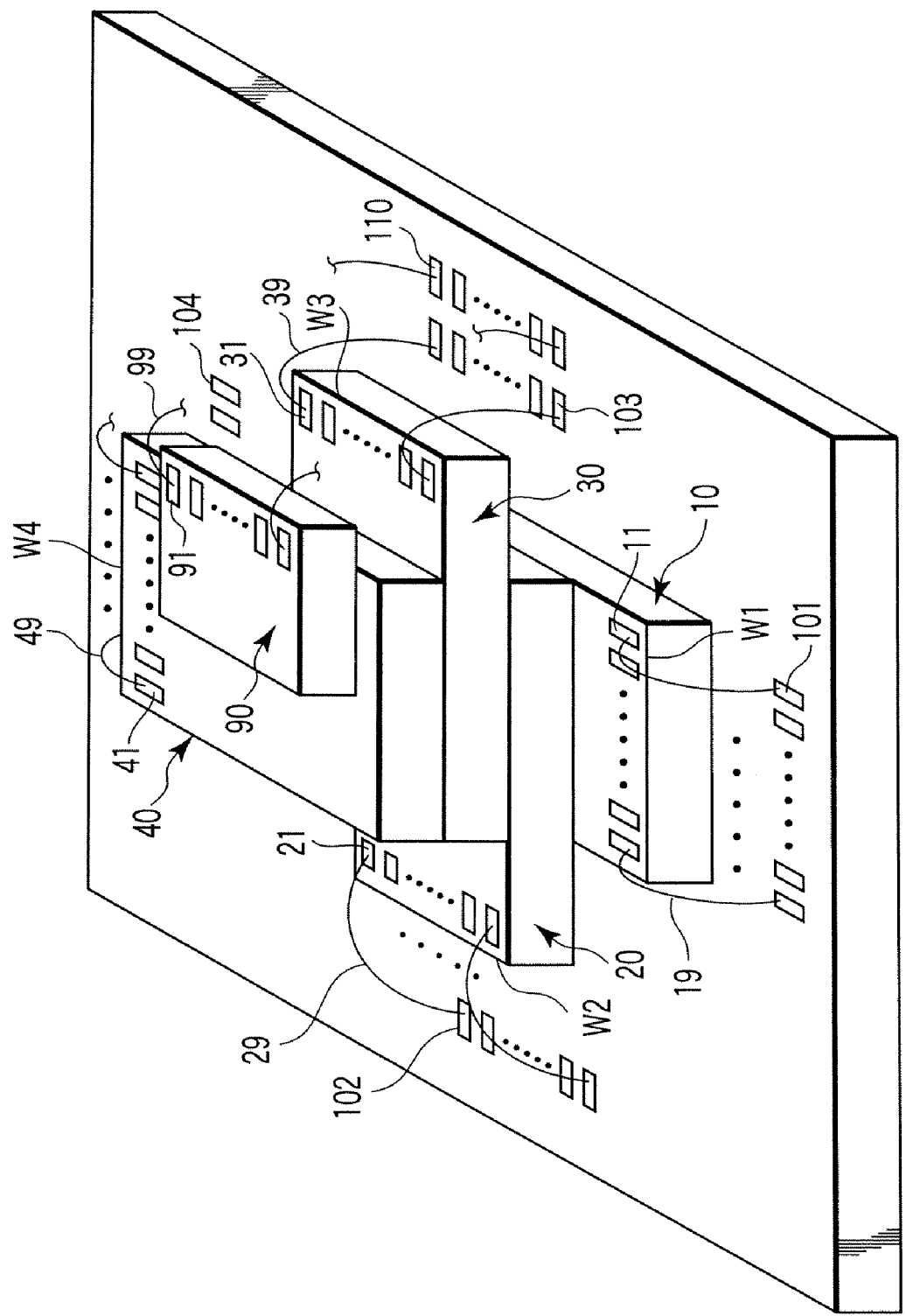
FIG. 8 is a perspective view of an MCP device according to a second example of the first embodiment.
Figure 9:
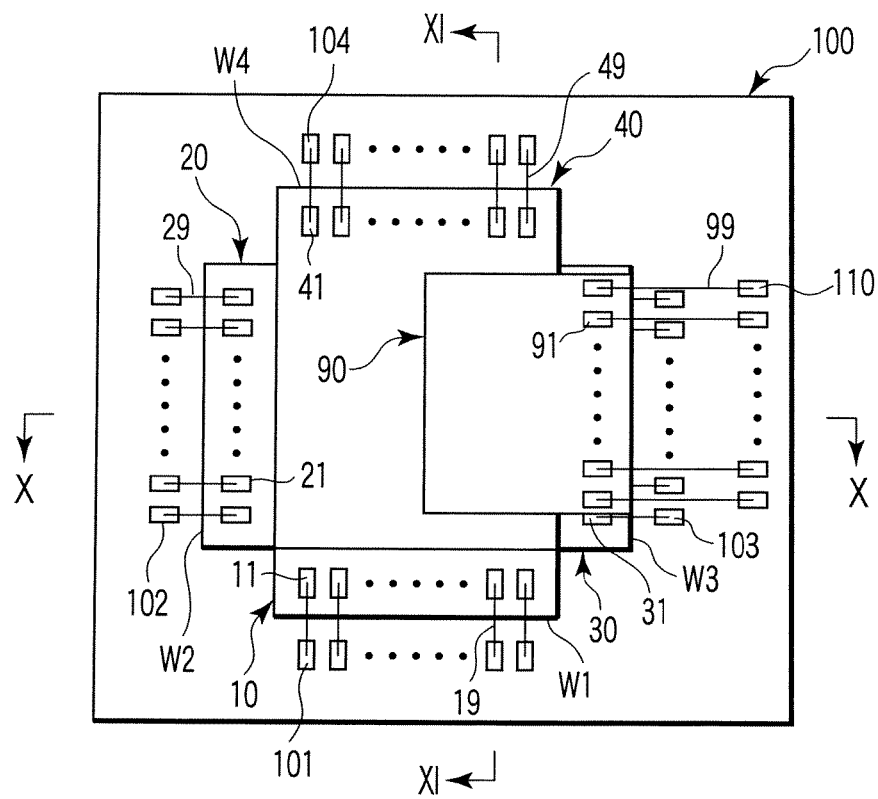
FIG. 9 is a plan view of the MCP device of the second example.
Figure 10:
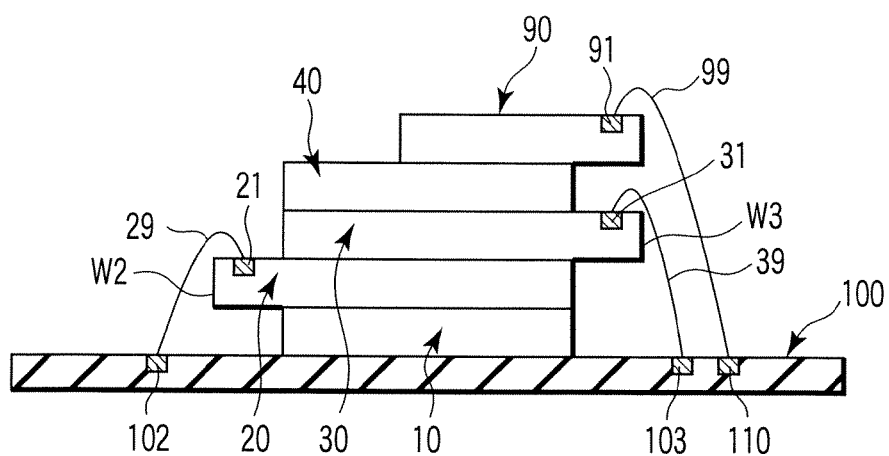
FIG. 10 is a sectional view taken along line X-X of FIG. 9.
Figure 11:
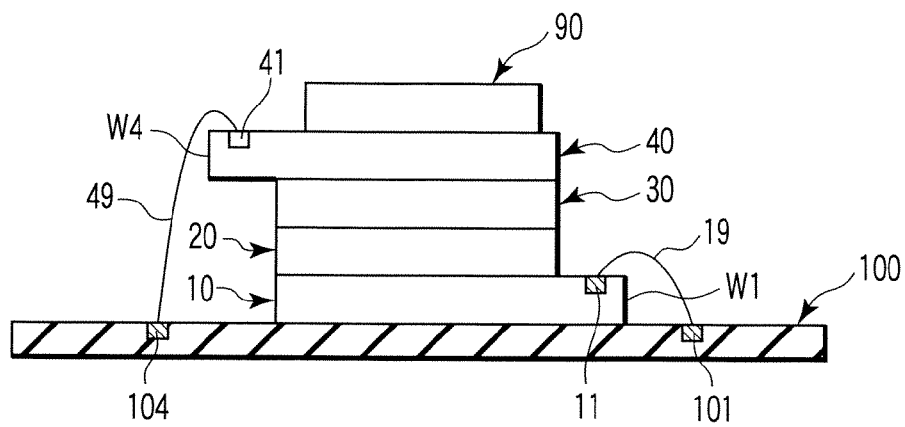
FIG. 11 is a sectional view taken along line XI-XI of FIG. 9.

FIG. 8 is a perspective view of the MCP device of this example. FIG. 9 is a plan view of the MCP device of this example. FIG. 10 is a sectional view taken along line X-X of FIG. 9 and FIG. 11 is a sectional view taken along line XI-XI of FIG. 9.

A first semiconductor chip 10 is placed on a package board 100. A second semiconductor chip 20 is placed on the semiconductor chip 10 so that its vertex at which its short and long sides along which no chip pads are arranged meet falls on such a vertex of the first chip, and their respective long sides intersect each other.

Thereby, a space for wire bonding of chip pads 11 of the first semiconductor chip 10 is secured.

A third semiconductor chip 30 is placed on the second semiconductor chip 20 so that its short side W3 along which chip pads 31 are arranged is oriented in a direction opposite to a short side W2 of the second chip along which chip pads 21 are arranged. In addition, the third semiconductor chip 30 is parallel moved in the direction in which its short side W3 is oriented so that its back does not come into contact with the chip pads 21 of the second chip 20. Thereby, a space for wire bonding of chip pads 21 of the second semiconductor chip 20 is secured.

A fourth semiconductor chip 40 is placed on the semiconductor chip 30 so that its short side W4 along which chip pads 41 are arranged is oriented in a direction opposite to the direction in which the pad-arranged short side W1 of the first chip 10 is oriented. In addition, the fourth semiconductor chip 40 is placed so that its short side along which no chip pads are arranged falls along a long side of the semiconductor chip 30.

The chip pads 11 to 41 may be either in mirror arrangement or in the same arrangement. When the pads are in mirror arrangement, for example, the chip pads 31 and 41 are arranged in mirror relation with respect to the chip pads 11 and 21.

Board pads 101 to 104 are set on the package board 100 to surround the stacked semiconductor chips.

The board pads 101 are connected to the chip pads 11. The board pads 102 are connected to the chip pads 21. The board pads 103 and 104 are connected to the chip pads 31 and 41, respectively.

Thus, the four semiconductor chips 10 to 40 can be stacked so that each of their respective short sides along which chip pads are arranged is oriented in a different direction.

Therefore, the bonding wires of each of the semiconductor chips can be led out in a different direction, thereby preventing bonding wires from being short-circuited.

In this example, it is only required that the bonding wires 19 to 49 are led out in four respective directions. That is, it is only required that each of the short sides of the respective semiconductor chips 10 to 40 along which the chip pads 11 to 41 are arranged be oriented in a different direction. There is no limitation to the orientation of each of the short sides W1 to W4 of the respective semiconductor chips 10 to 40 as long as a vertex of the overlying semiconductor chip at which its long side and its short side along which no chip pads are arranged meet falls on such a vertex of the underlying semiconductor chip and their respective long sides intersect each other.

For example, the semiconductor chips 10 to 40 may be stacked such that the short sides W1 and W3 of the respective chips 10 and 30 are oriented in opposite directions and the short sides W2 and W4 of the respective chips 20 and 40 are oriented in opposite directions.

(b) Interconnection Layout of Package Board

Figure 12:
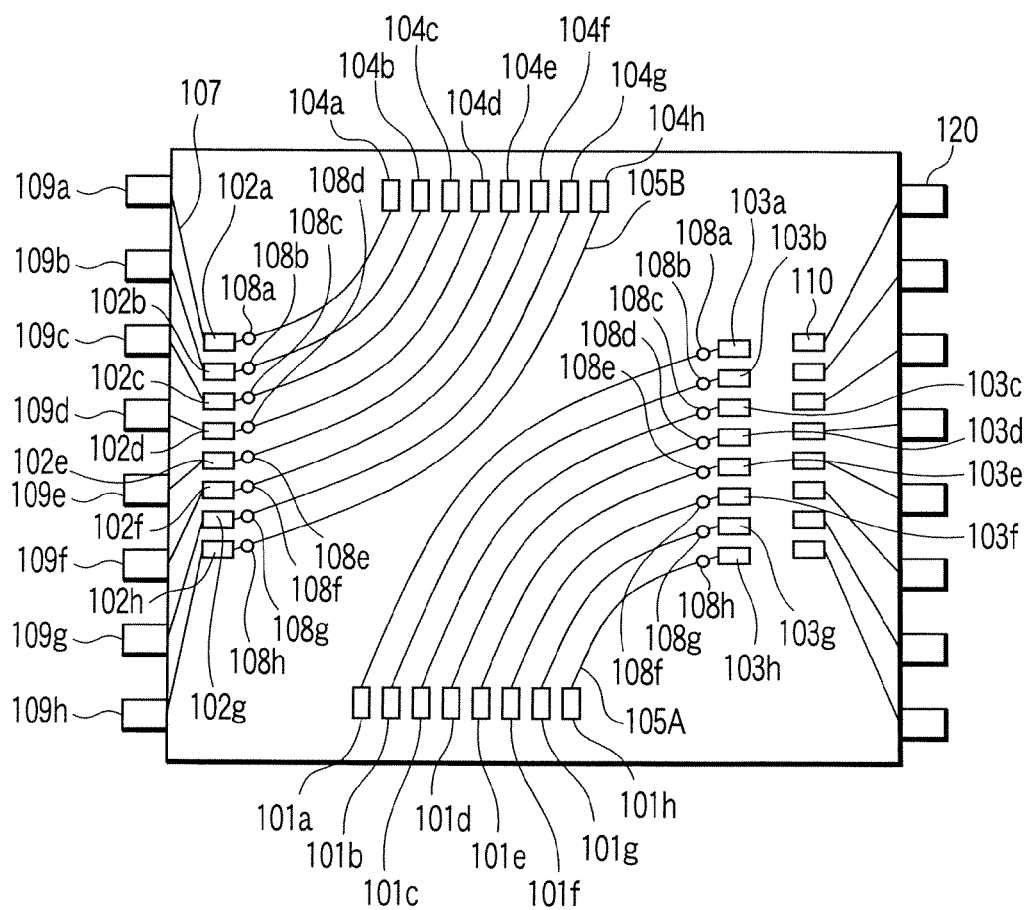
FIG. 12 schematically show interconnection layouts of the package board of the MCP device of the second example.
Figure 13:
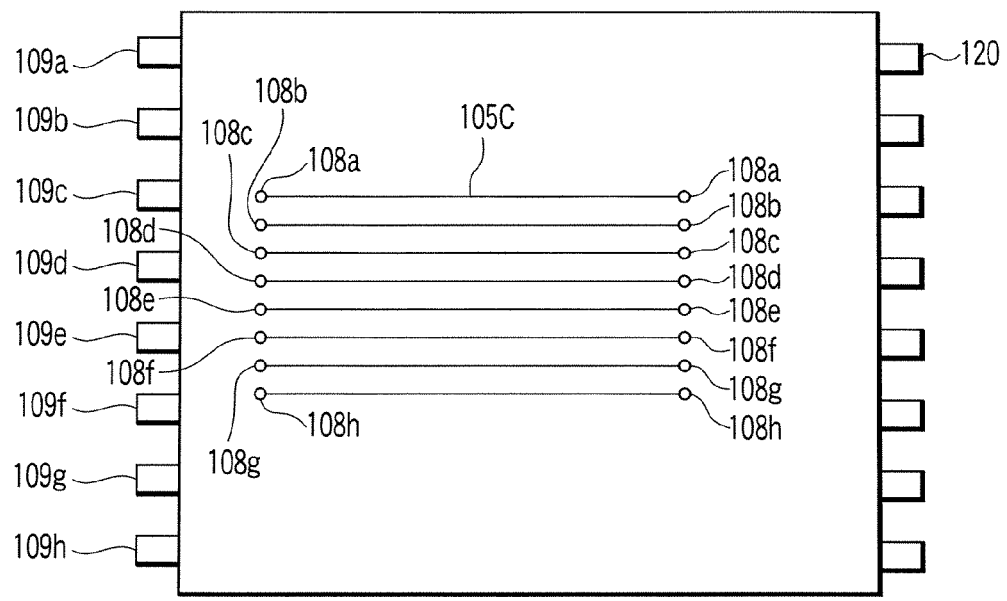
FIG. 13 schematically show interconnection layouts of the package board of the MCP device of the second example.
Figure 14:
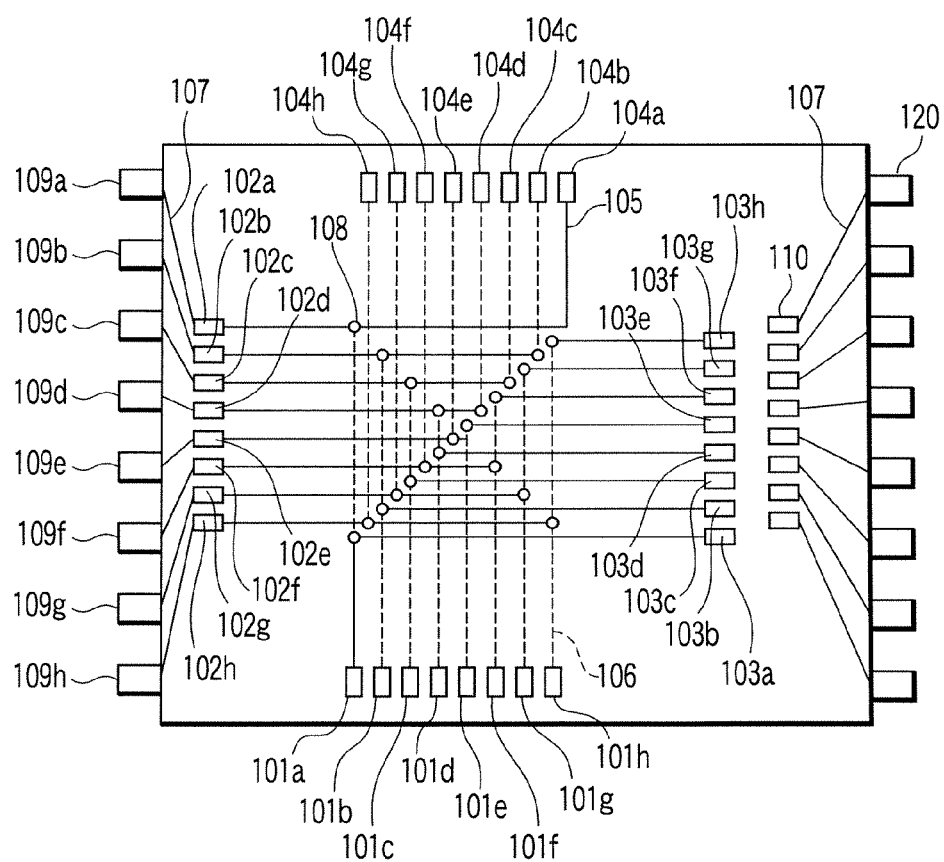
FIG. 14 schematically show interconnection layouts of the package board of the MCP device of the second example.

FIGS. 12, 13 and 14 schematically show interconnection layouts of the package board 100 for the MCP device shown in FIGS. 8 to 11. The interconnection layout will be described here on the assumption that each set of pads of the four semiconductor chips and the package board has eight pads. Note that the number of pads given here is merely exemplary.

As described above, each of the short sides of the respective semiconductor chips along which chip pads is arranged are oriented in a different direction.

As shown in FIG. 12, therefore, four sets of board pads 101$a$ to 101$h$, 102$a$ to 102$h$, 103$a$ to 103$h$ and 104$a$ to 104$h$ which are to be connected to the corresponding chip pads are placed in four different locations on the package board 100 which correspond to the pad-arranged short sides of the four semiconductor chips.

The board pads 103$a$ to 103$h$ and 104$a$ to 104$h$ are arranged in a mirror relation with respect to the board pads 101$a$ to 101$h$ and 102$a$ to 102$h$.

The board pads 101$a$ to 101$h$ are respectively connected to the board pads 103$a$ to 103$h$ by means of board interconnections 105A. The board pads 102$a$ to 102$h$ are respectively connected to the board pads 104$a$ to 104$h$ by means of board interconnections 105B.

In addition, as shown in FIG. 13, the package board 100 is provided with board interconnections 105$c$ on a lower side than the board interconnections 105A and 105B. The board interconnections 105A are connected to the board interconnections 105B through contacts 108$a$ to 108$h$ and the board interconnections 105C. Thereby, the board pads 101$a$ to 101$h$ and 103$a$ to 103$h$ are connected to external terminals 109$a$ to 109$h$ through the board pads 102$a$ to 102$h$.

The package board shown in FIGS. 12 and 13 allow the leading of interconnections to be simplified.

The board interconnections 105C may be set on the back side of the package board 100.

FIG. 14 shows an interconnection layout where semiconductor chips to be stacked are all the same in the arrangement of their chip pads.

In this case, the four sets of board pads 101$a$ to 101$h$, 102$a$ to 102$h$, 103$a$ to 103$h$ and 104$a$ to 104$h$ are also set in the same arrangement as shown in FIG. 14.

Board interconnections (indicated by solid lines) 105 provided on the surface of the package board 100 and board interconnections (indicated by broken lines) 106 provided on the back side of the package board are led out from the board pads 101$a$ to 101$h$, 102$a$ to 102$h$, 103$a$ to 103$h$ and 104$a$ to 104$h$ so as to form a lattice-like layout.

The contacts 108 are formed in the package board 100 so as to be arranged in the shape of the letter X.

Through these contacts 108 the board interconnections 105 are connected to the board interconnections 106.

The board pads 101$a$ to 101$h$, 103$a$ to 103$h$ and 104$a$ to 104$h$ are connected to the board pads 102$a$ to 102$h$ and further to external terminals 109$a$ to 109$h$. For example, the board pad 101$a$ is connected to the board pad 103$a$ by means of one of the board interconnections 105 on the top of the package board. The board pad 104$a$ is connected to the board pad 102$a$ by means of one of the board interconnections 105. The board pads 101$a$ and 103$a$ are connected to the board pad 102$a$ through two contacts 108 and one of the board interconnections 106 on the back of the package board.

The package board shown in FIG. 14 can be applied to semiconductor chips which are the same in the arrangement of chip pads, allowing the manufacturing cost of a semiconductor device (MCP) to be reduced.

Thus, the leading of package board interconnections can be simplified even if four sets of board pads are placed in four different locations on the package board.

(c) Application

Figure 15:
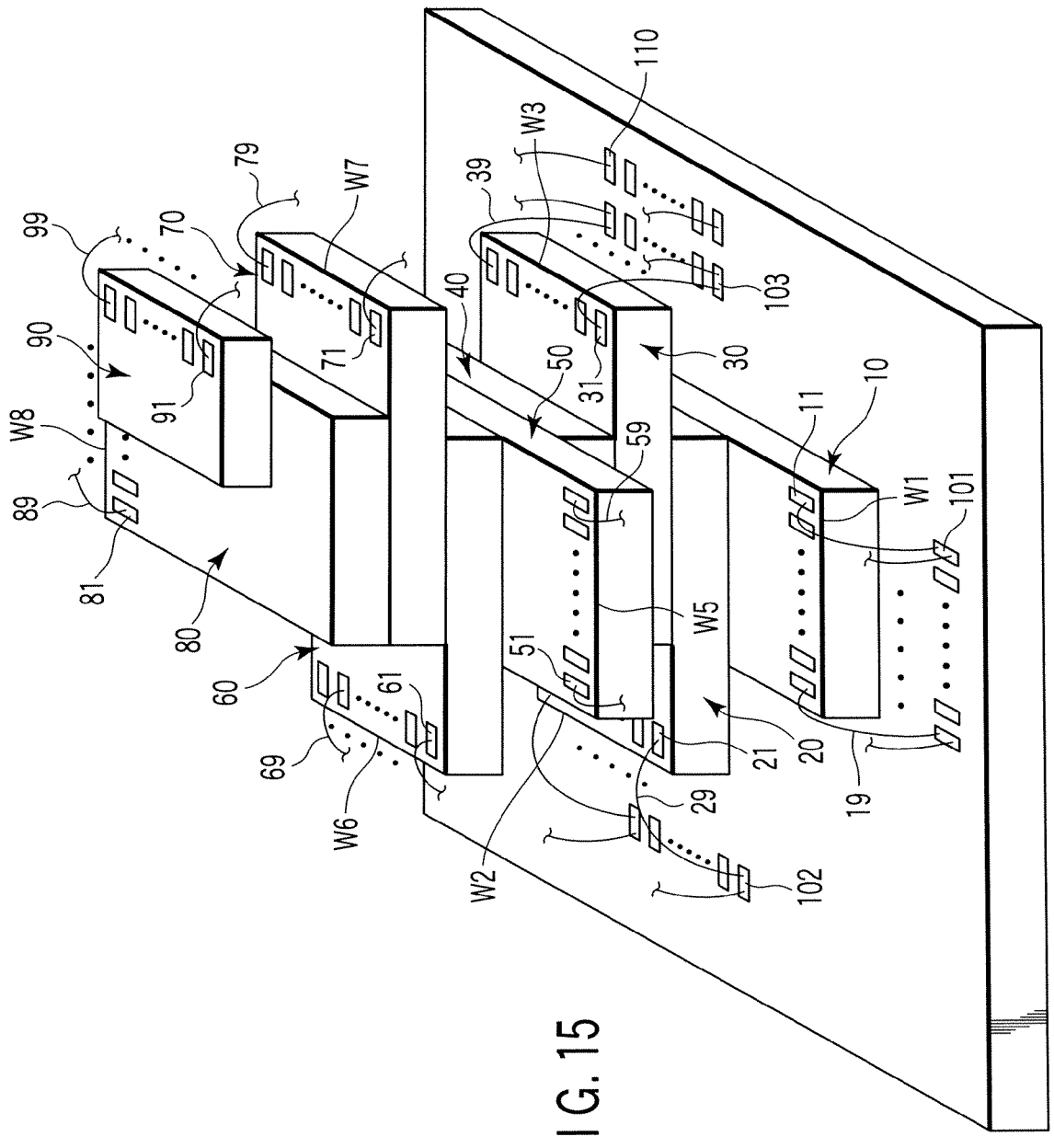
FIG. 15 is a perspective view of an MCP device according to an application of the second example.

FIG. 15 shows, in a perspective view, an application of the second example shown in FIGS. 8 to 11.

In this application, eight semiconductor chips are stacked, i.e., this stacked structure corresponds to two MCP devices of the second example.

As shown in FIG. 15, a semiconductor chip 50 is further laid on the semiconductor chip 40.

A short side W5 of the semiconductor chip 50 along which chip pads 51 are arranged is oriented in a direction opposite to the pad-arranged short side W4 of the semiconductor chip 40. In addition, the semiconductor chip 50 is parallel moved in the direction in which its short side W5 is oriented so that its back does not come into contact with the chip pads 41 of the semiconductor chip 40. Thereby, a space for wire bonding is secured. The side W5 is located on the same side as the pad-arranged side W1 of the semiconductor chip 10.

A sufficient space in the direction of thickness for wire bonding of the semiconductor chip 10 is secured because three semiconductor chips 20, 30 and 40 are interposed between the semiconductor chips 10 and 50.

The chip pads 51 of the semiconductor chip 50 are connected to the board pads 101 because its pad-arranged short side W5 is oriented in the same direction as the pad-arranged short side W1 of the semiconductor chip 10.

Semiconductor chips 60 to 80 are sequentially stacked on the semiconductor chip 50 in the same manner as the semiconductor chips 20 to 40 are stacked on the semiconductor chip 10.

Chip pads 61 of the semiconductor chip 60 are connected to the same board pads 102 as the chip pads 21 of the semiconductor chip 20. Likewise, chip pads 71 of the semiconductor chip 70 are connected to the same board pads as the chip pads 31 of the semiconductor chip 30, and chip pads 81 of the semiconductor chip 80 are connected to the same board pads as the chip pads 41 of the semiconductor chip 40.

As described above, it is also possible to stack four or more semiconductor chips.

(d) Modification

The second example has been described in terms of an MCP device adapted to prevent the short-circuiting of wires. This modification is directed to an MCP device in which the package size can be further reduced in addition to the advantage of the second example, which will be described with reference to FIGS. 16 through 19.

Figure 17:
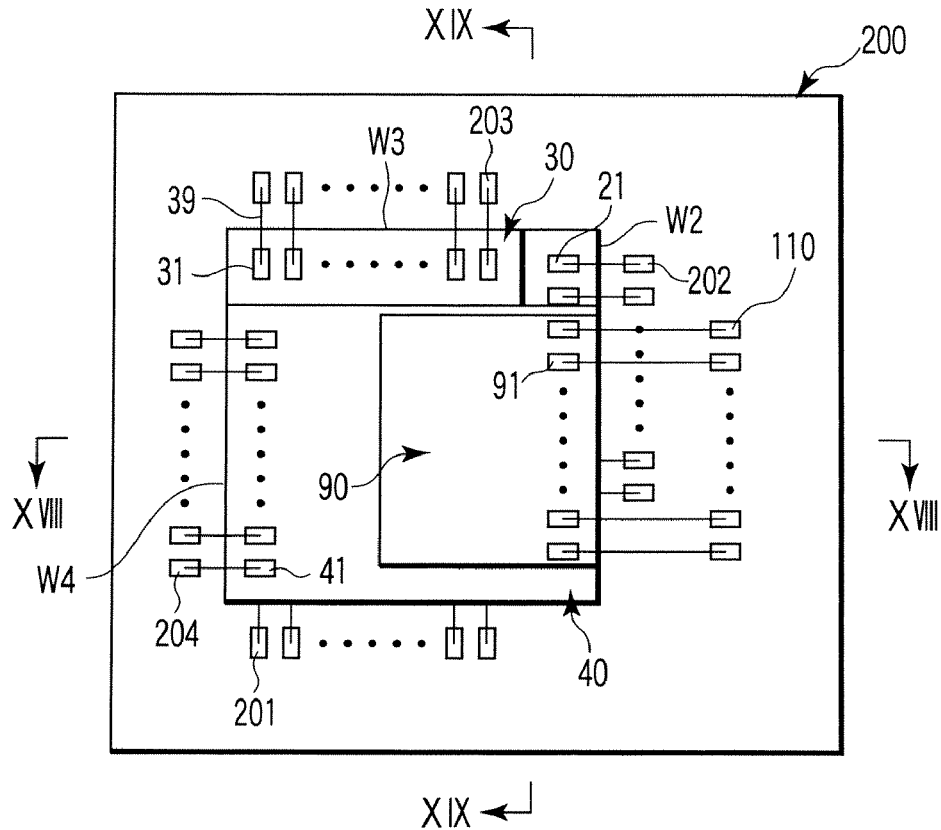
FIG. 17 is a plan view of the MCP device shown in FIG. 16.
Figure 18:
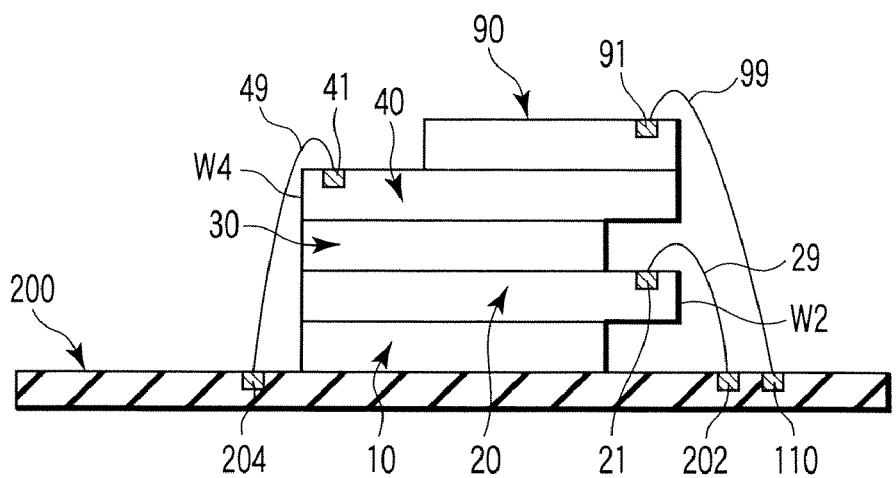
FIG. 18 is a sectional view taken along line XVIII-XVIII of FIG. 17.
Figure 19:
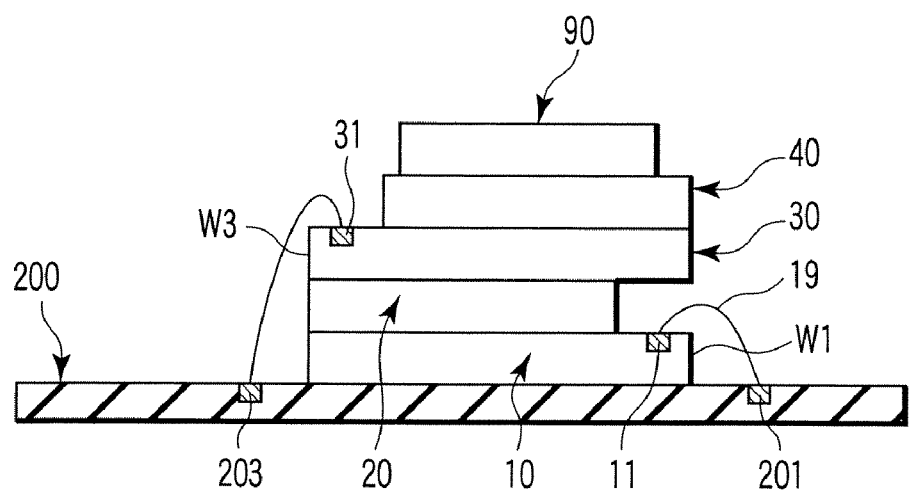
FIG. 19 is a sectional view taken along line XIX-XIX of FIG. 17.

FIG. 16 is a perspective view of the MCP device of this modification. FIG. 17 is a plan view of the MCP device of this modification. FIG. 18 is a sectional view taken along line XVIII-XVIII of FIG. 17 and FIG. 19 is a sectional view taken along line XIX-XIX of FIG. 17.

In this modification, like reference numbers are used to denote corresponding parts to those in the first and second examples to thereby simplify the description.

Semiconductor chips 10 to 40 are stacked in sequence on a package board 200. As in the second examples, the semiconductor chips 10 to 40 are stacked so that their respective pad-arranged short sides W1 to W4 are oriented in four different directions.

The chip pads 11 of the first semiconductor chip 10 are connected to board pads 201. The chip pads 21 of the second semiconductor chip 20 are connected to board pads 202. The chip pads 31 and 41 of the third and fourth semiconductor chips 30 and 40 are connected to board pads 203 and 204, respectively.

In this modification, the chip pads 21 and 31 are arranged in a mirror relation with respect to the chip pads 11 and 41. In such a case, as the interconnection layouts of the package board 200 on which the semiconductor chips 10 to 40 are stacked, the interconnection layouts shown in FIGS. 12 and 13 can be used.

Therefore, the board pads 202 and 203 shown in FIGS. 16 to 19 are in the same arrangement as the chip pads 21 and 31 but are arranged in a mirror relation with respect to the board pads 201 and 204 connected to the chip pads 11 and 41.

In that case, the board pads 201 and the board pads 204 of FIGS. 16 to 19 correspond in their arrangement to the board pads 101$a$ to 101$h$ and the board pads 102$a$ to 102$h$ shown in FIG. 12, respectively. Likewise, the board pads 202 and the board pads 203 correspond in their arrangement to the board pads 103$a$ to 103$h$ and the board pads 104$a$ to 104$h$, respectively.

The chip pads 21 and 31 of the semiconductor chips 20 and 30 shown in FIGS. 16 to 19 may be the same in their arrangement as the chip pads 11 and 41. In that case, the interconnection layout shown in FIG. 14 can be used, in which case the board pads 201 and the board pads 202 correspond in their arrangement to the board pads 101$a$ to 101$h$ and the board pads 103$a$ to 103$h$, respectively. In addition, the board pads 203 and the board pads 204 correspond in their arrangement to the board pads 104$a$ to 104$h$ and the board pads 102$a$ to 102$h$, respectively.

Figure 20:
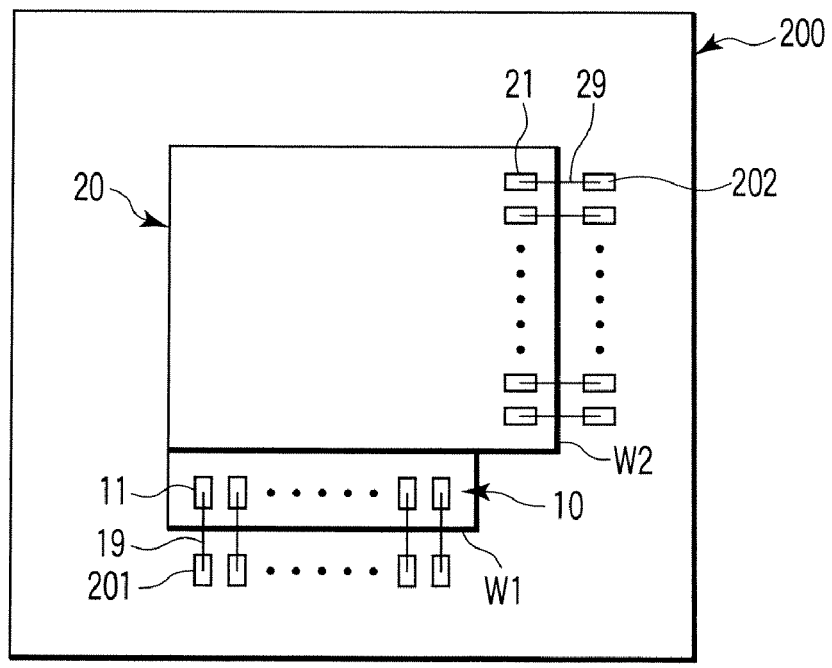
FIG. 20 is a plan view illustrating the structure of the modification stepwise.
Figure 21:
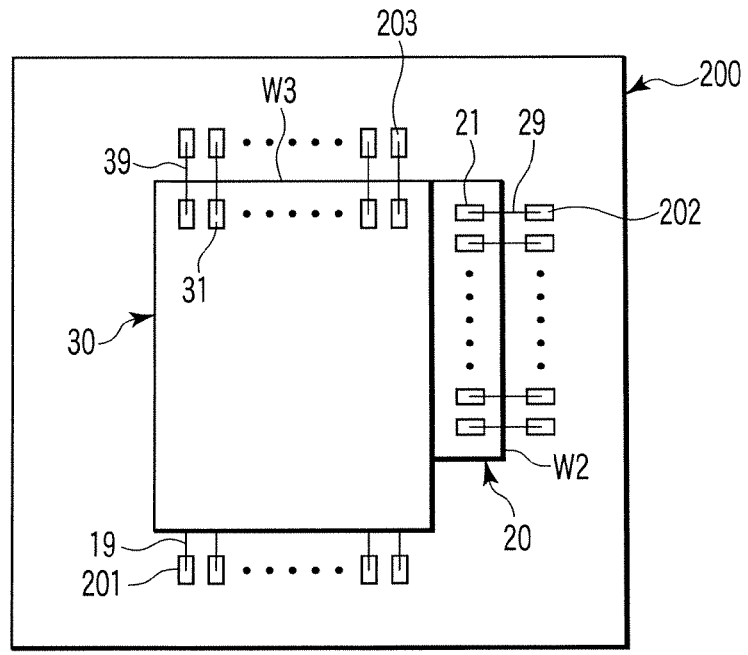
FIG. 21 is a plan view illustrating the structure of the modification stepwise.
Figure 22:
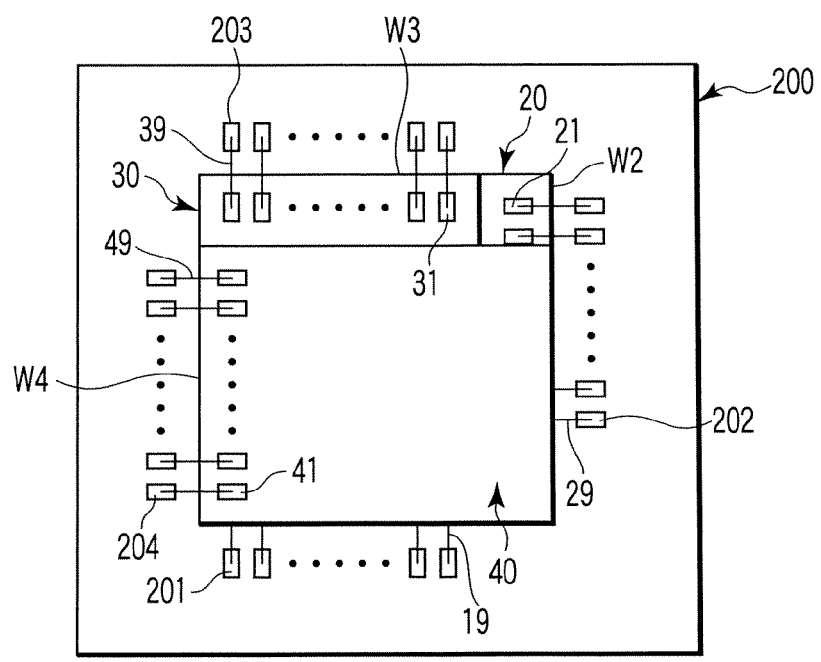
FIG. 22 is a plan view illustrating the structure of the modification stepwise.

Reference is now made to FIGS. 20, 21 and 22 to describe the structure of this modification stepwise. As shown in FIG. 20, the first semiconductor chip 10 is placed on the package board 200.

The second semiconductor chip 20 is placed on the first semiconductor chip 10 so that its vertex at which its long side and its short side along which no pads are arranged meet falls on such a vertex of the first chip 10. A space for wire bonding of the chip pads 11 of the first semiconductor chip 10 is therefore secured.

As shown in FIG. 21, the third semiconductor chip 30 is placed on the second semiconductor chip 20 so that its pad-arranged short side W3 falls along that long side of the second chip 20 and moreover its short side opposite to the short side W3 is oriented in the same direction as the pad-arranged short side W1 of the first chip 10.

For this reason, the back side of the third semiconductor chip 30 comes to be located over the chip pads 11 of the first semiconductor chip 10; however, space in the direction of thickness for wire bonding of the chip pads 11 is secured through the thickness of the second semiconductor chip 20.

As shown in FIG. 22, the fourth semiconductor chip 40 is placed on the third semiconductor chip 30 so that its pad-arranged short side W4 falls along a long side of the third chip 30 and moreover its short side opposite to the short side W4 is oriented in the same direction as the pad-arranged short side W2 of the second chip 20.

In this case, space in the direction of thickness for wire bonding of the chip pads 21 of the semiconductor chip 20 is secured through the thickness of the third semiconductor chip 30.

Thus, stacking the semiconductor chips in the above-mentioned manner allows the short-circuiting of bonding wires to be prevented and moreover the package size to be further reduced.

(D) Second Embodiment

The first embodiment has been described in terms of an MCP device in which chip pads are arranged along one short side of each semiconductor chip.

There also exists a semiconductor chip which has chip pads arranged along each of its short sides.

This embodiment is directed to an MCP device which uses semiconductor chips each of which is provided with chip pads along each of its short sides.

In this embodiment, like reference numbers are used to denote corresponding parts to those in the first embodiment to thereby simplify the description.

(a) Structure

Reference is made to FIGS. 23 through 26 to describe the structure of the MCP device of the second embodiment.

Figure 23:
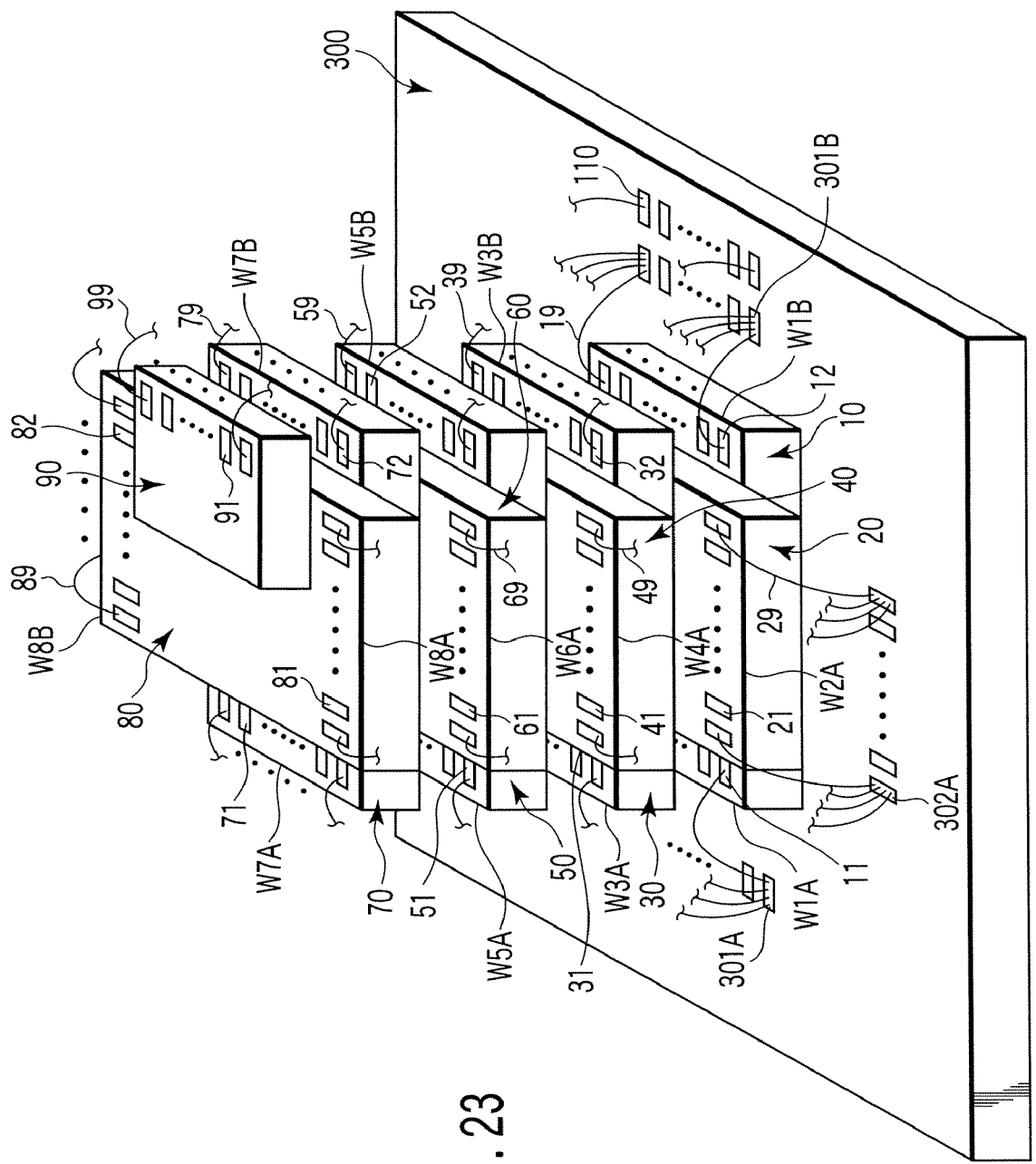
FIG. 23 is a perspective view of an MCP device according to a second embodiment.
Figure 24:
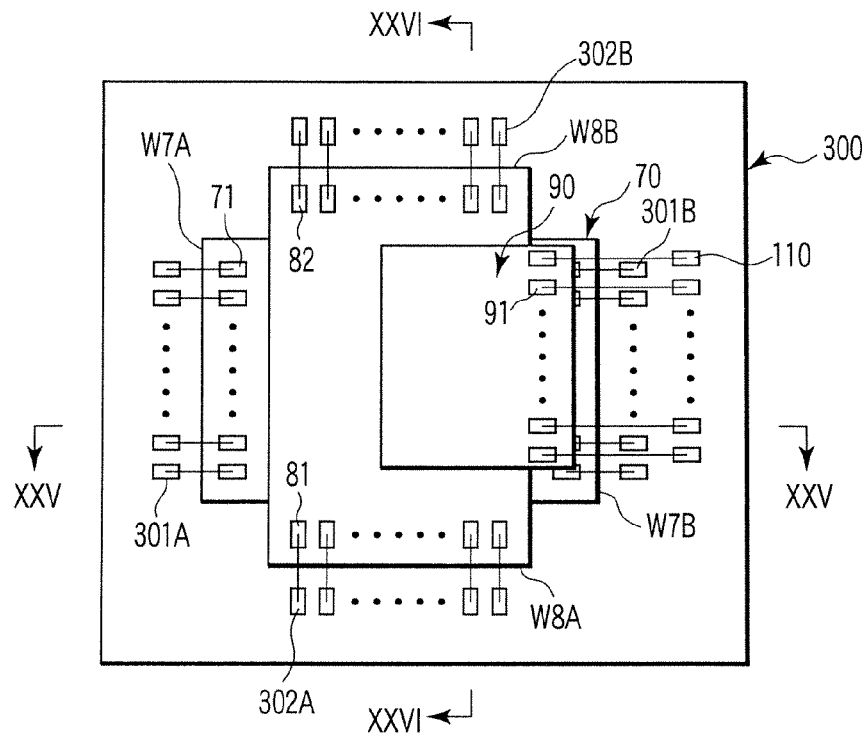
FIG. 24 is a plan view of the MCP device of FIG. 23.
Figure 25:
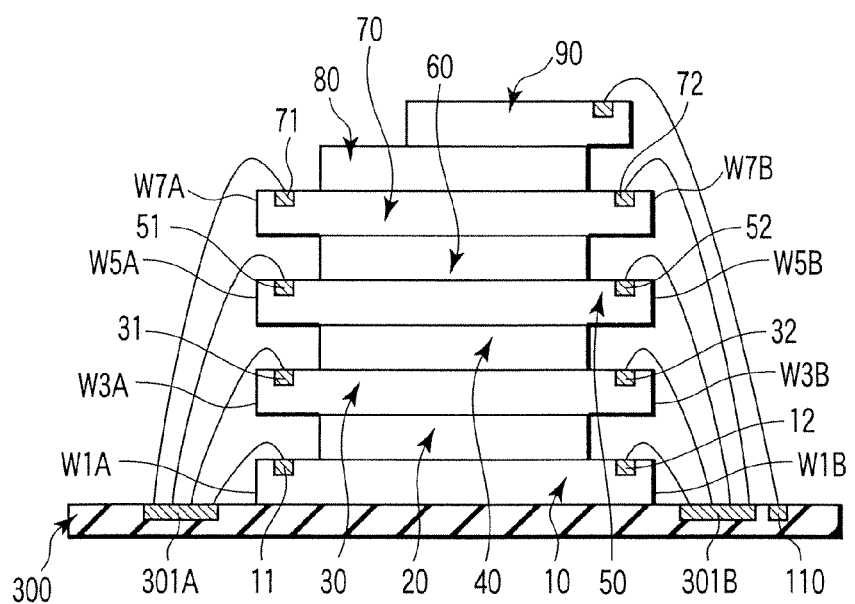
FIG. 25 is a sectional view taken along line XXV-XXV of FIG. 24.
Figure 26:
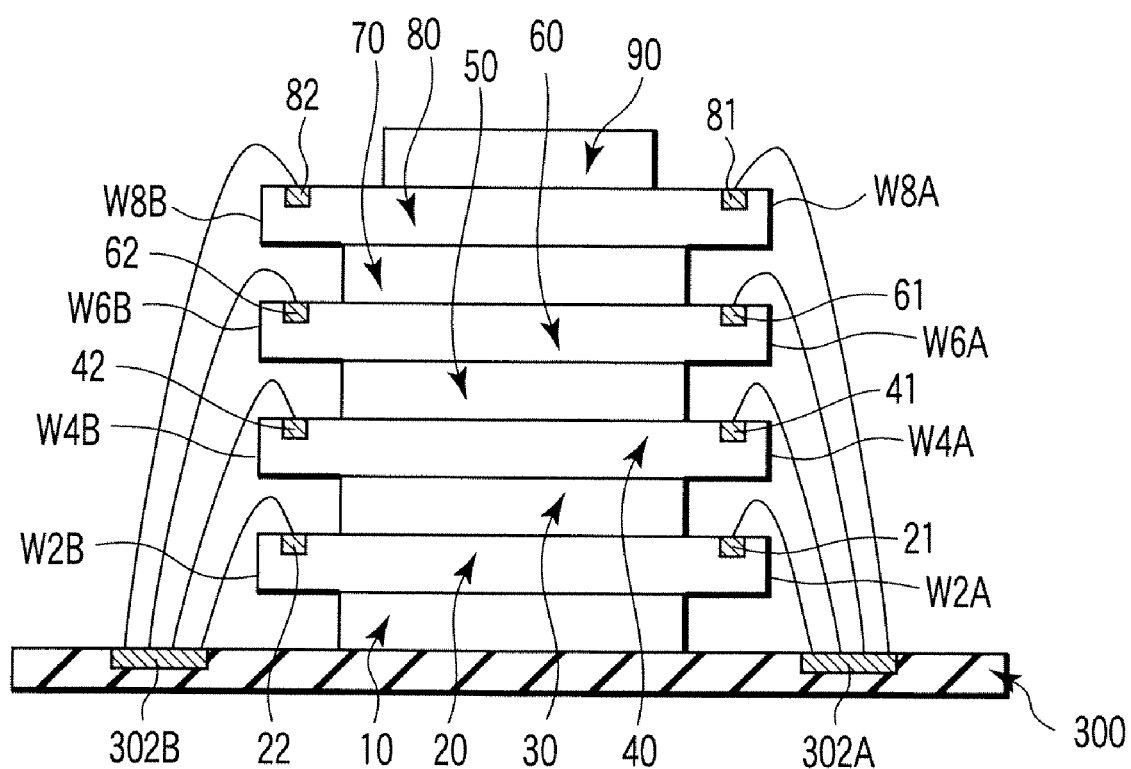
FIG. 26 is a sectional view taken along line XXVI-XXVI of FIG. 24.

FIG. 23 is a perspective view of the MCP device of this embodiment. FIG. 24 is a plan view of the MCP device of this embodiment. FIG. 25 is a sectional view taken along line XXV-XXV of FIG. 24 and FIG. 26 is a sectional view taken along line XXVI-XXVI of FIG. 24.

As shown in FIGS. 23 through 26, eight semiconductor chips 10 to 80 are stacked on a package board 300. Each of these semiconductor chips is a memory chip by way of example. Although, in this embodiment, there is illustrated the configuration such that eight semiconductor chips are stacked, this is not restrictive and it is only required to use at least two semiconductor chips.

A first semiconductor chip 10 is placed on the package board 300. The first semiconductor chip 10 is formed on top with first and second sets of chip pads 11 and 12.

Of these chip pads, the first chip pads 11 are arranged along a short side W1A of the semiconductor chip 10. The second chip pads 12 are arranged along a short side W1B. That is, the semiconductor chip 10 is provided with the first and second sets of chip pads 11 and 12 along each of its short sides.

The second chip pads 12 are arranged in a mirror relation with respect to the first chip pads 11.

A second semiconductor chip 20 is laid on the first semiconductor chip 10.

The second semiconductor chip 20 is provided with chip pads 21 along its short side W2A and with chip pads 22 along its short side W2B.

The second semiconductor chip 20 is placed on the first semiconductor chip 10 so that its long sides intersect a long side of the chip 10 and it is located between the short sides W1A and W1B of the chip 10 to avoid contact with the chip pads 11 and 12 of the chip 10.

In this case, to secure space for wire bonding of the underlying semiconductor chip, the short side of the overlying semiconductor chip is set shorter than the long side of the underlying semiconductor chip so as not to overlap with the chip pads of the underlying chip.

The third chip pads 21 are in the same arrangement as the first chip pads 11. The fourth chip pads 22 are arranged in a mirror relation with respect to the third chip pads 21.

A third semiconductor chip 30 is placed on the second semiconductor chip 20.

The third semiconductor chip 30 is placed on the second semiconductor chip 20 so that its long sides intersect the long sides of the second chip 20.

The third semiconductor chip 30 is provided with chip pads 31 along its short side W3A and with chip pads 32 along its short side W3B. The chip pads 31 and 32 are in the same arrangement as the chip pads 11 and 12, respectively.

In this case, the third semiconductor chip 30 is located above the pad-arranged short sides W1A and W1B of the first semiconductor chip 10; however, a space in the direction of thickness for wire bonding of the semiconductor chip 10 is secured owing to the thickness of the second semiconductor chip 20.

The fourth through eighth semiconductor chips 40 to 80 are stacked so that their long sides intersect one another as with the first, second and third semiconductor chips 10 to 30.

A memory controller chip 90 is placed on the semiconductor chip 80.

The chip pads 51 to 81 of the semiconductor chips 50 to 80 are in the same arrangement as the chip pads 11 of the semiconductor chip 10. The chip pads 52 to 82 of the semiconductor chips 50 to 80 are in mirror arrangement as with the chip pads 12 of the semiconductor chip 10.

The chip pads 11, 31, 51 and 71 are connected to board pads 301A on the package board 300. The chip pads 12, 32, 52 and 72 are connected to board pads 301B on the package board 300.

The chip pads 21, 41, 61 and 81 are connected to board pads 302A on the package board 300. The chip pads 22, 42, 62 and 82 are connected to board pads 302B on the package board 300.

When the chip pads 12 to 82 of the stacked semiconductor chips shown in FIGS. 23 through 26 are arranged in a mirror relation with respect to the chip pads 11 to 81, the interconnection layouts shown in FIGS. 12 and 13 can be applied to the package board 300. In this case, the board pads 301B and 302B shown in FIGS. 23 through 26 are set in the same arrangement as the chip pads 12 to 82 but in mirror arrangement with respect to the board pads 301A and 302A.

In this case, the third board pads 302A and the first board pads 301A in FIGS. 23 through 26 correspond in arrangement to the board pads 101a to 101h and the board pads 102a to 102h shown in FIG. 12, respectively. Likewise, the second board pads 301B and the fourth board pads 302B correspond in arrangement to the board pads 103a to 103h and the board pads 104a to 104h, respectively.

All the sets of chip pads of the semiconductor chips 10 to 80 shown in FIGS. 23 to 26 may be in the same arrangement. In that case, the board pads 302A shown in FIGS. 23 through 26 correspond in arrangement to the board pads 101a to 101h shown in FIG. 14. The board pads 301B correspond to the board pads 103a to 103h. The board pads 302B correspond to the board pads 104a to 104h. The board pads 301A correspond to the board pads 102a to 102h.

As described above, when each of semiconductor chips to be stacked is provided with pads along each of its short sides, these semiconductor chips are stacked so that the long sides of the overlying semiconductor chip intersect the long sides of the underlying semiconductor chip and the overlying semiconductor chip is located between the two short sides of the underlying semiconductor chip.

Therefore, even if an additional semiconductor chip is placed on the overlying semiconductor chip, the overlying chip plays the role of a spacer for securing space in the direction of thickness for wire bonding of the underlying semiconductor chip.

Thus, space for wire bonding of the underlying semiconductor chip can be secured without using any spacer, allowing the size in the direction of thickness of the MCP device to be reduced.

Furthermore, the leading of board interconnections of the package board can be simplified.

In this embodiment, different types of semiconductor chips may be used. In addition, semiconductor chips need not to be the same size provided that they can be stacked in the above-stated manner and space for wire bonding can be secured.

(E) Third Embodiment

The first and second embodiments have been described in terms of MCP devices in which pads are arranged along their short sides.

However, pads may be arranged along a long side L of the semiconductor chip shown in FIG. 1.

The third embodiment is directed to an MCP device which uses semiconductor devices each of which has chip pads arranged along one of its long sides.

Reference is made to FIGS. 27 through 30 to describe the structure of the MCP device of the third embodiment. In this embodiment, like reference numbers are used to denote corresponding parts to those in the first and second embodiments to thereby simplify the description.

Figure 27:
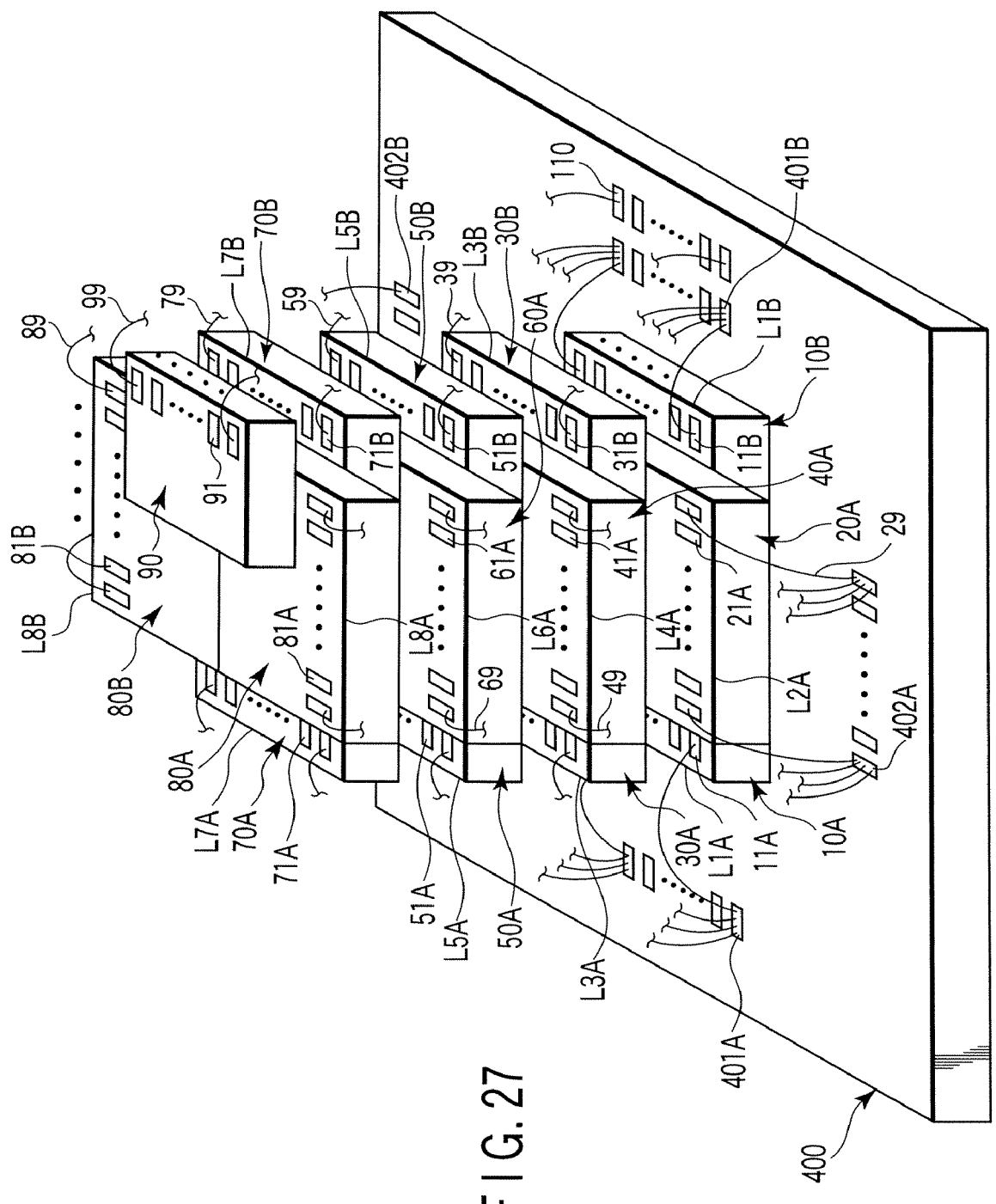
FIG. 27 is a perspective view of an MCP device according to a third embodiment.
Figure 28:
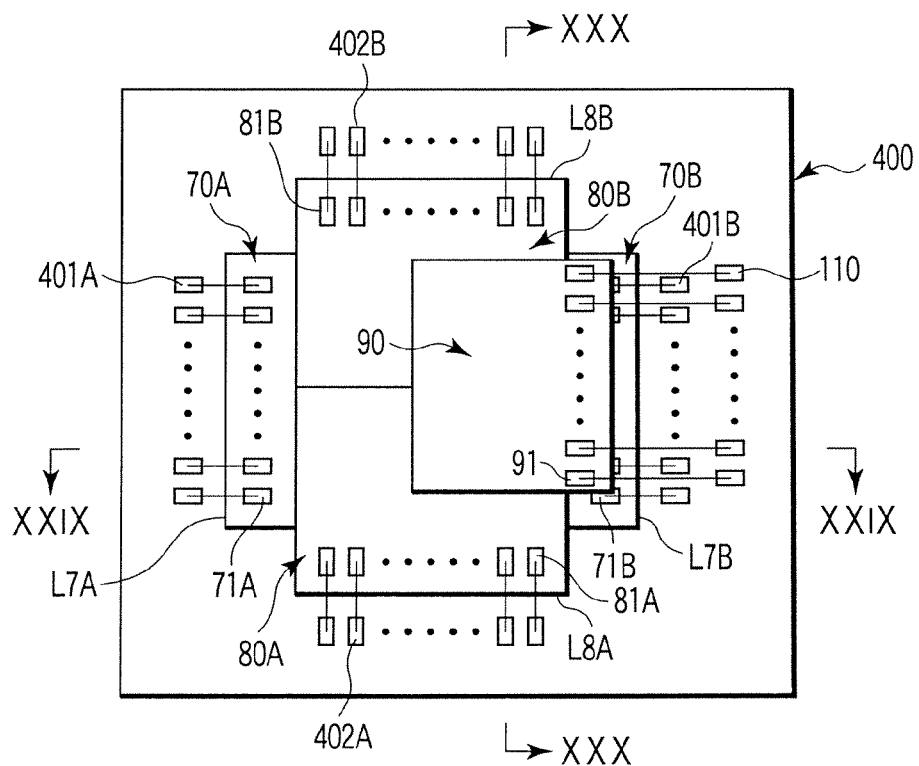
FIG. 28 is a plan view of the MCP device shown in FIG. 27.
Figure 29:
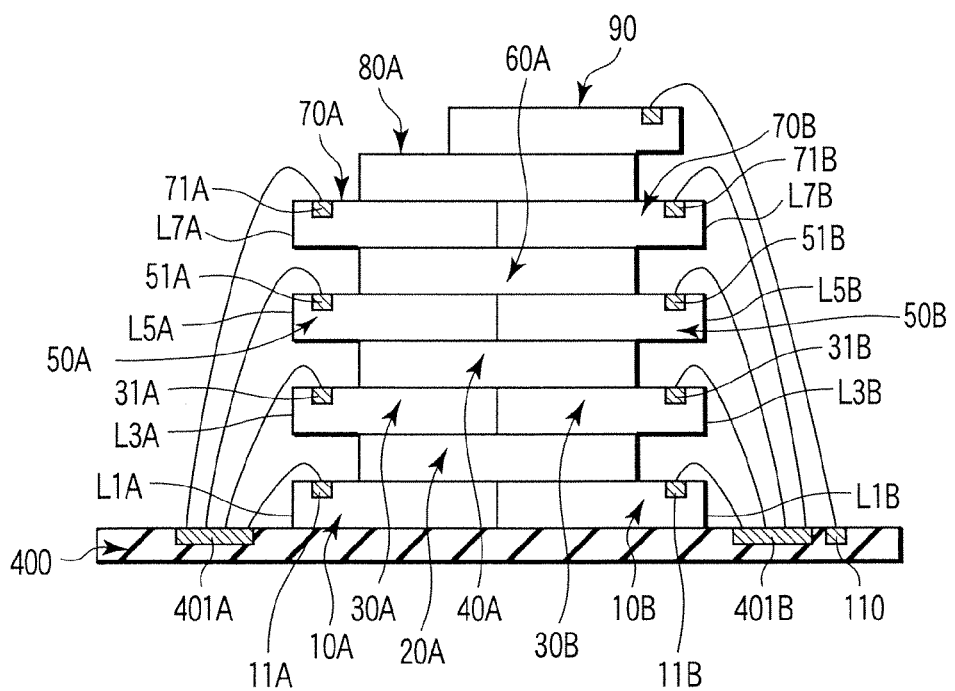
FIG. 29 is a sectional view taken along line XXIX-XXIX of FIG. 28.
Figure 30:
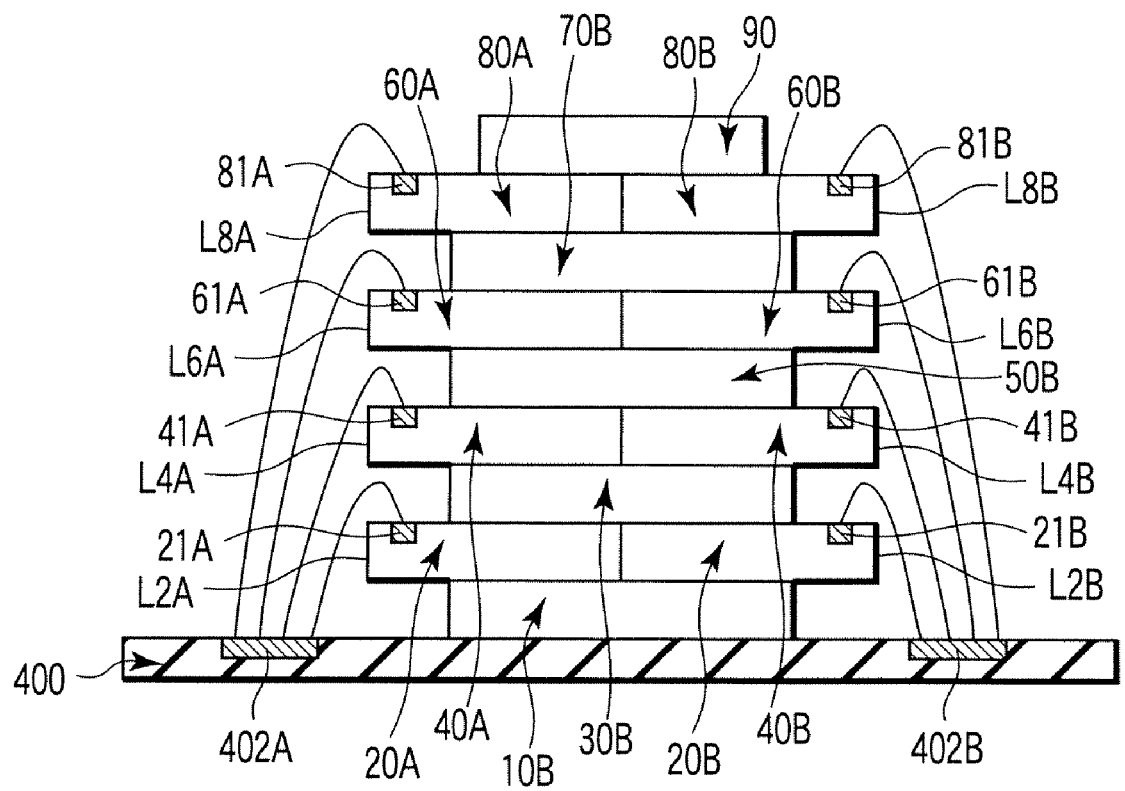
FIG. 30 is a sectional view taken along line XXX-XXX of FIG. 28.

FIG. 27 is a perspective view of the MCP device of this embodiment. FIG. 28 is a plan view of the MCP device of this embodiment. FIG. 29 is a sectional view taken along line XXIX-XXIX of FIG. 28 and FIG. 30 is a sectional view taken along line XXX-XXX of FIG. 28.

Semiconductor chips 10A to 80A and 10B to 80B are provided on top with sets of pads 11A to 81A and 11B to 81B along their respective long sides L1A to L8A and L1B to L8B. These chips are stacked on a package board 400. In the MCP device of this embodiment, sixteen semiconductor chips are used; however, this is not restrictive and the MCP device can be configured using at least four semiconductor chips.

The first and second semiconductor chips 10A and 10B are both placed on the package board 400. More specifically, the first and second semiconductor chips 10A and 10B are placed side by side on the package board 400 so that the side of the chip 10A opposite to its side L1A along which the first pads 11A are arranged and the side of the chip 10B opposite to its side L1B along which the first pads 11B are arranged, i.e., the long sides of the respective chips 10A and 10B along which no pads are arranged, come into contact with each other.

The chip pads 11B are arranged in a mirror relation with respect to the chip pads 11A.

The third and fourth semiconductor chips 20A and 20B are placed on the semiconductor chips 10A and 10B.

As with the semiconductor chips 10A and 10B, the semiconductor chips 20A and 20B are placed side by side so that their respective long sides along which no pads are arranged come into contact with each other.

The semiconductor chips 20A and 20B are placed side by side on the semiconductor chips 10A and 10B so that their short sides intersect the short sides of the respective underlying semiconductor chips.

In this case, it is required to secure space for wire bonding of the pads 11A and 11B of the underlying semiconductor chips 10A and 10B. To meet this requirement, the length of the short sides of the respective underlying semiconductor chips must be set larger than half the length of the long sides of the respective overlying semiconductor chips.

The third chip pads 21A of the third semiconductor chip 20A are in the same arrangement as the first chip pads 11A of the first semiconductor chip 10A but are arranged in a mirror relation with respect to the fourth chip pads 21B of the fourth semiconductor chip 20B.

The semiconductor chips 30A and 30B are placed on the semiconductor chips 20A and 20B so that their short sides intersect the short sides of the underlying chips 20A and 20B. Furthermore, the semiconductor chips 30A and 30B are arranged side by side so that their respective long sides along which no pads are arranged come into contact with each other.

As with the semiconductor chips 10A to 30A and 10B to 30B, the other semiconductor chips 40A to 80A and 40B to 80B are stacked so that two corresponding semiconductor chips are arranged side by side with their respective short sides along which no pads are arranged in contact with each other and the short sides of the overlying semiconductor chips intersect the short sides of the underlying semiconductor chips.

The chip pads 11A, 31A, 51A and 71A are connected to board pads 401A on the package board 400, while the chip pads 11B, 31B, 51B and 71B are connected to board pads 401B on the package board 400.

The chip pads 21A, 41A, 61A and 81A are connected to board pads 402A on the package board 400, while the chip pads 21B, 41B, 61B and 81B are connected to board pads 402B on the package board 400.

As described above, when use is made of semiconductor chips whose chip pads are in mirror arrangement, the interconnection layouts shown in FIGS. 12 and 13 can be used for the package board 400. In this case, the board pads 401B and 402B shown in FIGS. 27 through 30 are in the same arrangement as the chip pads 11B and 21B but are in mirror arrangement with respect to the board pads 401A and 402A. The first board pads 401A and the fourth board pads 402A respectively correspond in arrangement to the board pads 102a to 102h and the board pads 101a to 101h shown in FIG. 12. Likewise, the second board pads 401B and the third board pads 402B respectively correspond in arrangement to the board pads 103a to 103h and the board pads 104a to 104h.

All the sets of chip pads of the semiconductor chips 10A to 80A and 10B to 80B may be in the same arrangement. In that case, the board pads 402A shown in FIGS. 27 to 30 correspond in arrangement to the board pads 101a to 101h shown in FIG. 14. The board pads 401B correspond to the board pads 103a to 103h. The board pads 402B correspond to the board pads 104a to 104h. The board pads 401A correspond to the board pads 102a to 102h.

As described above, when semiconductor chips each of which is provided with pads along its long side are stacked, two semiconductor chips on the lower side are placed side by side with that their respective long sides along which no pads are arranged in contact with each other. The two semiconductor chips on the upper side are placed side by side on the underlying semiconductor chips so that their respective long sides along which no pads are arranged come into contact with each other and their short sides intersect the short sides of the underlying semiconductor chips.

Therefore, the third embodiment allows sixteen semiconductor chips to be stacked in a thickness corresponding to eight semiconductor chips. That is, a plurality of semiconductor chips can be packaged so that the thickness of the resulting MCP device becomes equal to half the sum of thicknesses of the individual semiconductor chips used.

With the arrangement of the MCP device of this embodiment, when additional semiconductor chips are placed on the overlying semiconductor chips, the overlying chips play the role of a spacer for securing a space in the direction of thickness for wire bonding of the underlying semiconductor chips.

Therefore, a space for wire bonding of the underlying semiconductor chips can be secured without using any spacer, allowing the size in the direction of thickness of the package device to be reduced.

Furthermore, the leading of board interconnections of the package board can be simplified.

In this embodiment, use may be made of different types of semiconductor chips. The semiconductor chips need not to be the same size provided that they can be stacked in the above manner and space for wire bonding can be secured.

3. Application

Figure 31:
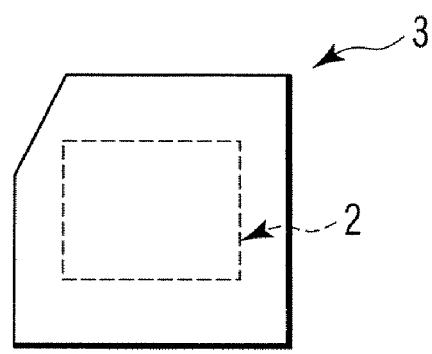
FIG. 31 shows a memory card which is an application of the present invention.

FIG. 31 shows a memory card which is an application of the present invention.

An MCP device 2 which is comprised of a plurality of semiconductor chips is incorporated into the memory card 3. The semiconductor chips are memory chips each of which consists of a nonvolatile semiconductor memory (for example, a flash memory).

These memory chips are stacked in a structure described in either of the first, second and third embodiments and sealed with an insulating packaging material.

The memory card 3 is used in digital cameras, mobile phones, audio equipment, etc.

According to the MCP device of the present invention, the storage capacity of memory cards can be increased and the size of the memory cards can be reduced.

4. Others

The embodiments of the present invention can reduce the size and thickness of a multi-chip package device and simplify the interconnections within the package device.

The embodiments of the present invention can reduce the manufacturing cost of the multi-chip package device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a package board which has a plurality of first board pads arranged on the package board, has a plurality of second board pads arranged on the package board, has first interconnections provided on the surface of the package board and connected to the first board pads, has second interconnections provided below the surface of the package board and connected to the second board pads, and has a plurality of contacts provided in the package board to connect the first interconnections to the second interconnections;

a first semiconductor chip which is rectangular in shape, has a plurality of first pads arranged along a short side of the first semiconductor chip and is placed on the package board; and a second semiconductor chip which is rectangular in shape, has a plurality of second pads arranged along a short side of the second semiconductor chip and is placed on the first semiconductor chip so that a vertex of the second semiconductor chip at which a long side of the second semiconductor chip and the short side of the second semiconductor chip along which no pads are arranged meet falls on a vertex of the first semiconductor chip at which a long side of the first semiconductor chip and the short side of the first semiconductor chip along which no pads are arranged, and the long sides of the first and second semiconductor chips intersect each other, wherein the arrangement of the second pads is the same as arrangement of the first pads, the arrangement of the second board pads is the same as arrangement of the first board pads, each of the first board pads is connected to a respective one of the first pads, and each of the second board pads is connected to a respective one of the second pads.

2. The semiconductor device according to claim 1, wherein the first and second semiconductor chips are the same size.

3. The semiconductor device according to claim 1, wherein the second pads of the second semiconductor chip are arranged in a mirror relation with respect to the first pads of the first semiconductor chip.

4. The semiconductor device according to claim 3, wherein the package board is provided on top with a plurality of first board pads each of which is connected to a respective one of the first pads and a plurality of second board pads which are arranged in a mirror relation with respect to the first board pads and each of which is connected to a respective one of the second pads of the second semiconductor chip.

5. The semiconductor device according to claim 1, further comprising a third semiconductor chip which is rectangular in shape, has a plurality of third pads arranged along its short side and is placed on the second semiconductor chip.

6. The semiconductor device according to claim 5, wherein the third semiconductor chip is placed on the second semiconductor chip so that its short side along which the third pads are arranged is oriented in the same direction as the short side of the second semiconductor chip along which no pads are arranged and its back does not overlay the second pads of the second semiconductor chip.

7. The semiconductor device according to claim 5, wherein the third semiconductor chip is placed on the second semiconductor chip so that its vertex at which its long side and its short side along which the third pads are arranged meet falls on a vertex of the second semiconductor chip, its long side intersects a long side of the second semiconductor chip, and its short side along which the third pads are arranged is oriented in the opposite direction to the short side of the first semiconductor chip along which the first pads are arranged.

8. The semiconductor device according to claim 5, wherein the third semiconductor chip is the same structure as the first semiconductor chip.

* * * * *